(12) United States Patent  (10) Patent No.: US 7,519,348 B2
Shah  (45) Date of Patent: Apr. 14, 2009

(54) HARMONIC SUPPRESSION MIXER AND TUNER

(75) Inventor: Peter Shah, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 777 days.

(21) Appl. No.: 11/078,050

(22) Filed: Mar. 11, 2005

(65) Prior Publication Data
US 2005/0239430 A1  Oct. 27, 2005

Related U.S. Application Data

(60) Provisional application No. 60/636,584, filed on Dec. 16, 2004, provisional application No. 60/552,864, filed on Mar. 12, 2004.

(51) Int. Cl.
H04B 1/10 (2006.01)
(52) U.S. Cl. ........................... 455/285; 455/302
(58) Field of Classification Search .......... 455/280, 455/284, 285, 293, 302, 312, 313, 323, 324, 455/326
See application file for complete search history.

(56) References Cited

U.S. PATENT DOCUMENTS

| | | | |
|---|---|---|---|
| 4,264,784 A | 4/1981 | Lorea | |
| 4,502,148 A | 2/1985 | Ishida et al. | |
| 6,226,509 B1 | 5/2001 | Mole et al. | |
| 6,397,051 B1 | 5/2002 | Abbasi et al. | |
| 6,433,647 B1 | 8/2002 | Filoramo et al. | |
| 7,085,547 B2 | 8/2006 | Asayama et al. | |
| 7,130,604 B1 | 10/2006 | Wong et al. | |
| 2004/0005869 A1 | 1/2004 | See et al. | |

(Continued)

FOREIGN PATENT DOCUMENTS

WO  WO 2004/006433  1/2004

OTHER PUBLICATIONS

Weldon et al, "A 1.75 GHz Highly Integrated Narrow Band CMOS Transmitter with Harmonic Rejection Mixers", IEEE International Solid-State Conference,Feb. 6, 2001, ISCCC 2001/Session 10/Wireless Building Blocks/10.4, IEEE, New York, US.

(Continued)

Primary Examiner—Nguyen Vo
(74) Attorney, Agent, or Firm—Michael W. Landry; Bruce W. Greenhaus

(57) ABSTRACT

A harmonic suppression mixer for down converting an RF signal to a complex I and Q baseband signal that uses a plurality of switching mixers each with a gain stage to produce a sinusoidal weighted sum of the mixer outputs. Odd harmonics output by each switching mixer is suppressed in the composite signal. A low skew local oscillator (LO) clock generator creates multiple LO phases and drives the mixers. The mixer can be used in low noise direct conversion RF tuners. The mixer is configurable by programming gain stage coefficient values to achieve a variable number of effective mixers used in combination. At low tuning frequencies, all available mixers are programmed with unique coefficients and driven by different LO clock phases to achieve maximum harmonic suppression. At high tuning frequencies, some mixers are paralleled and duplicate coefficients are programmed or mixers are disabled to reduce the number of effective mixers.

27 Claims, 23 Drawing Sheets

U.S. PATENT DOCUMENTS

2004/0147238 A1* 7/2004 Wang et al. .................. 455/208
2005/0232382 A1 10/2005 Stikvoort et al.
2007/0117530 A1* 5/2007 Davis .......................... 455/316

OTHER PUBLICATIONS

Weldon et al, "A Integrated CMOS Multi-Standard Transmitter for DCS1800/DECT", Jun. 24, 1999 Presentation, Hitachi Ltd.

* cited by examiner

FIG. 5  8 phase, 1 cycle, I LO
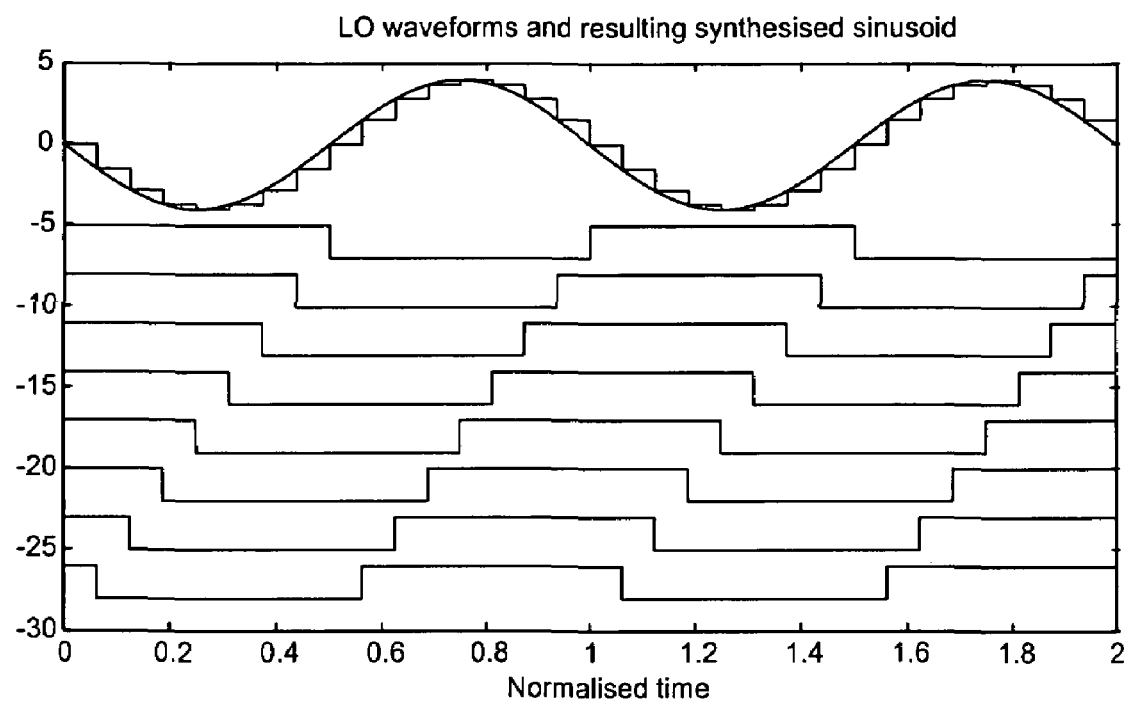
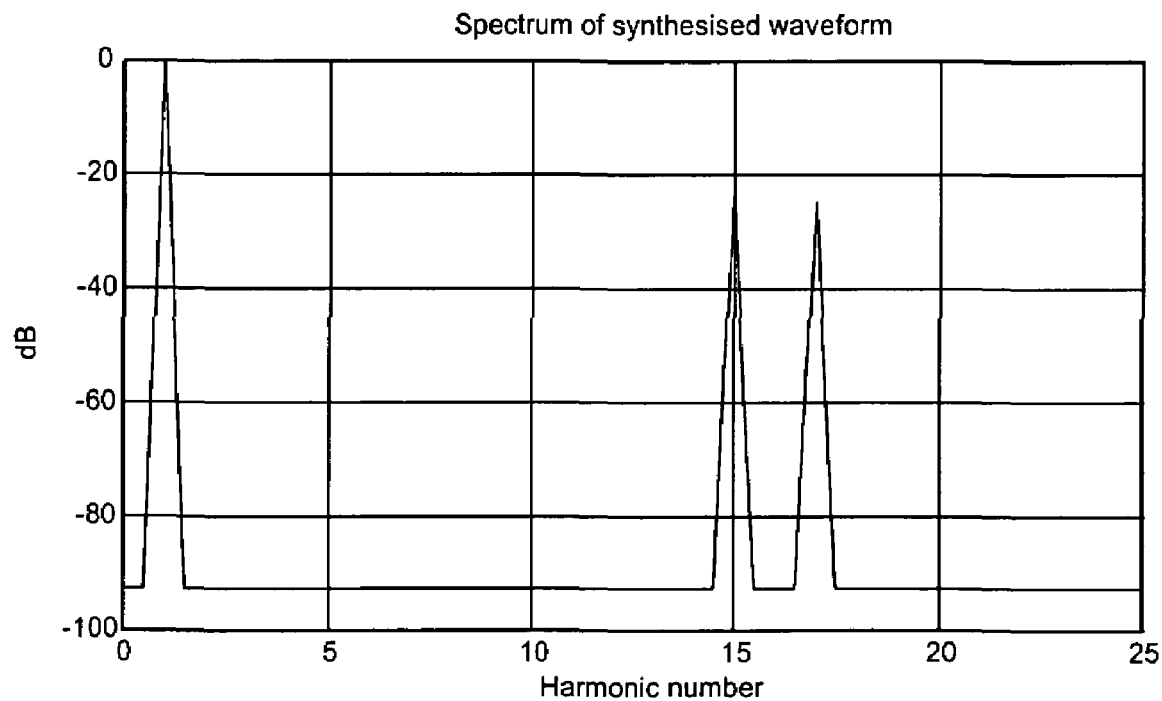

FIG. 6  8 phase, 1 cycle, Q LO
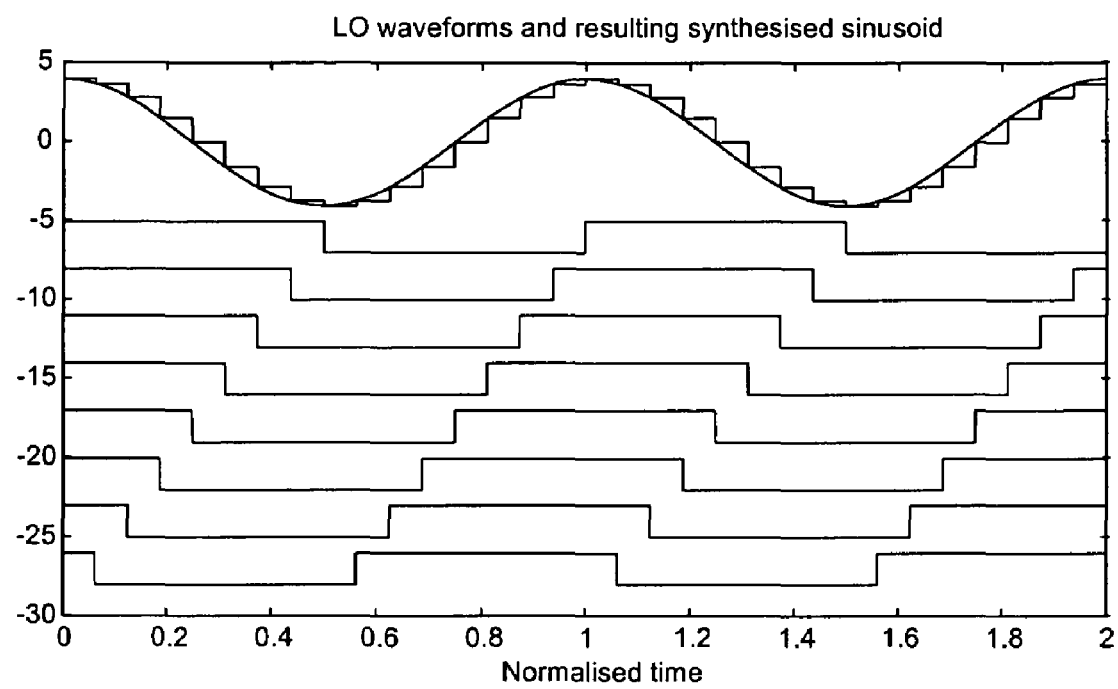
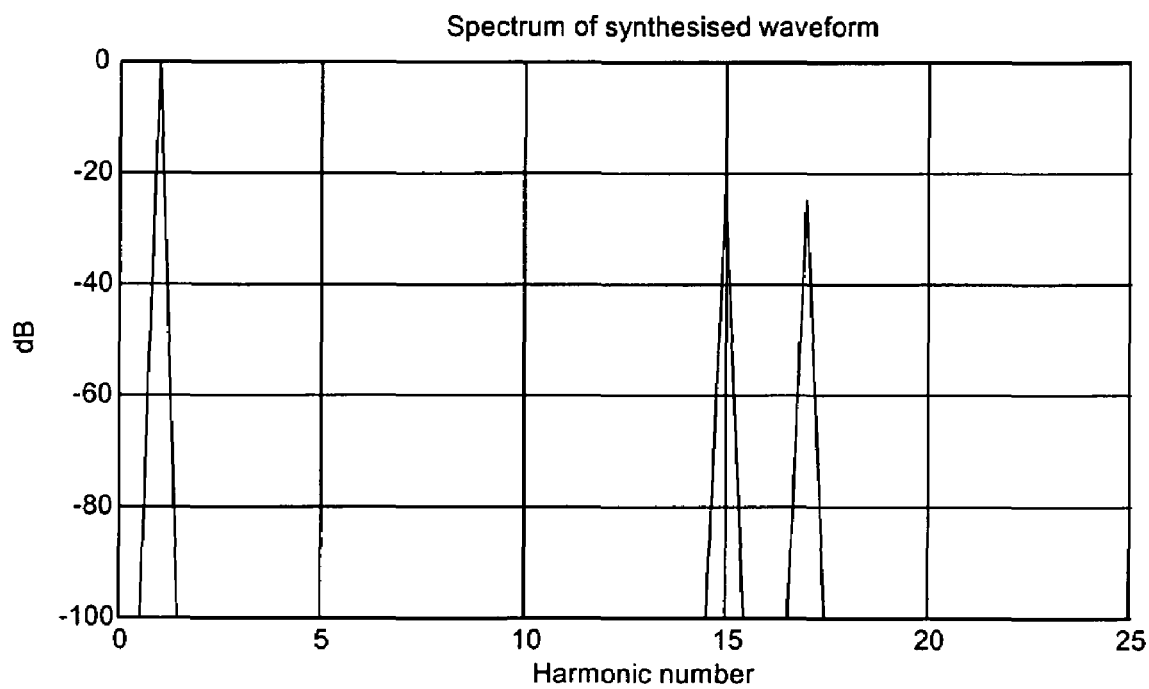

FIG. 7  8 phase, 3 cycle, I LO
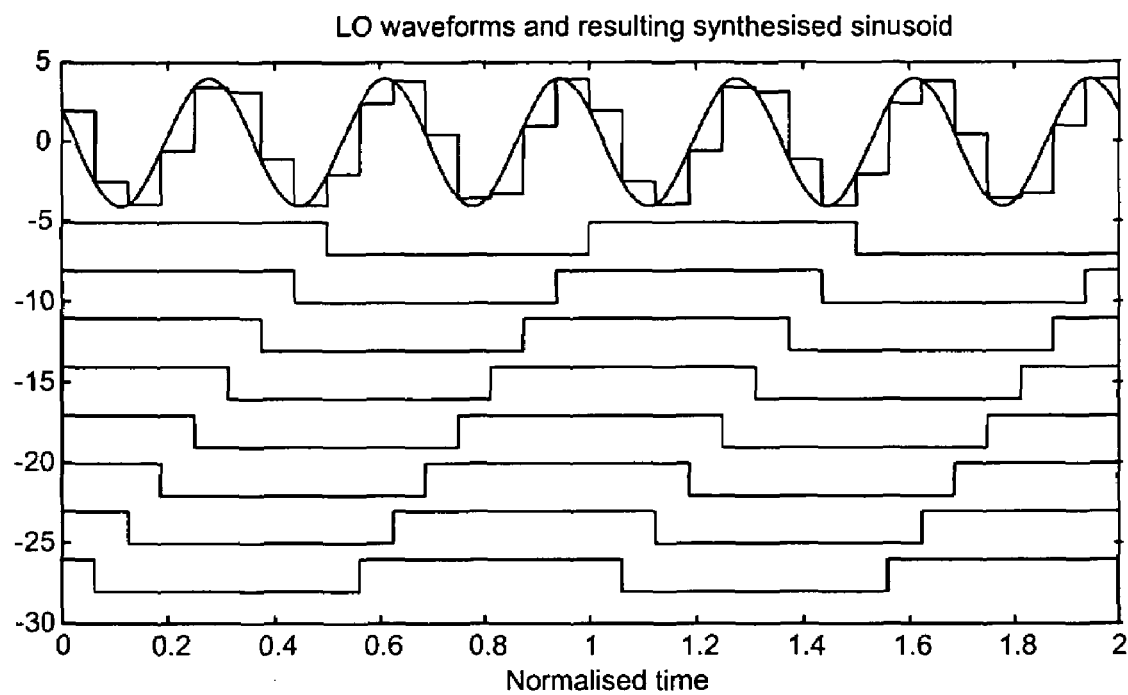
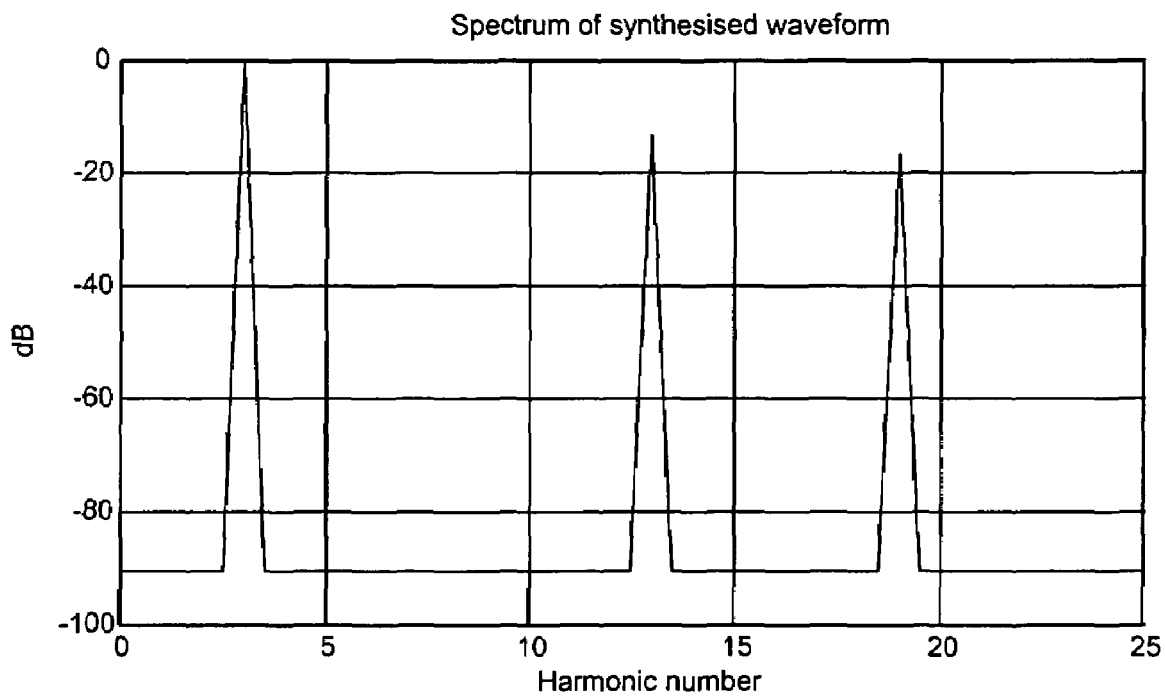

FIG. 8  8 phase, 3 cycle, Q LO
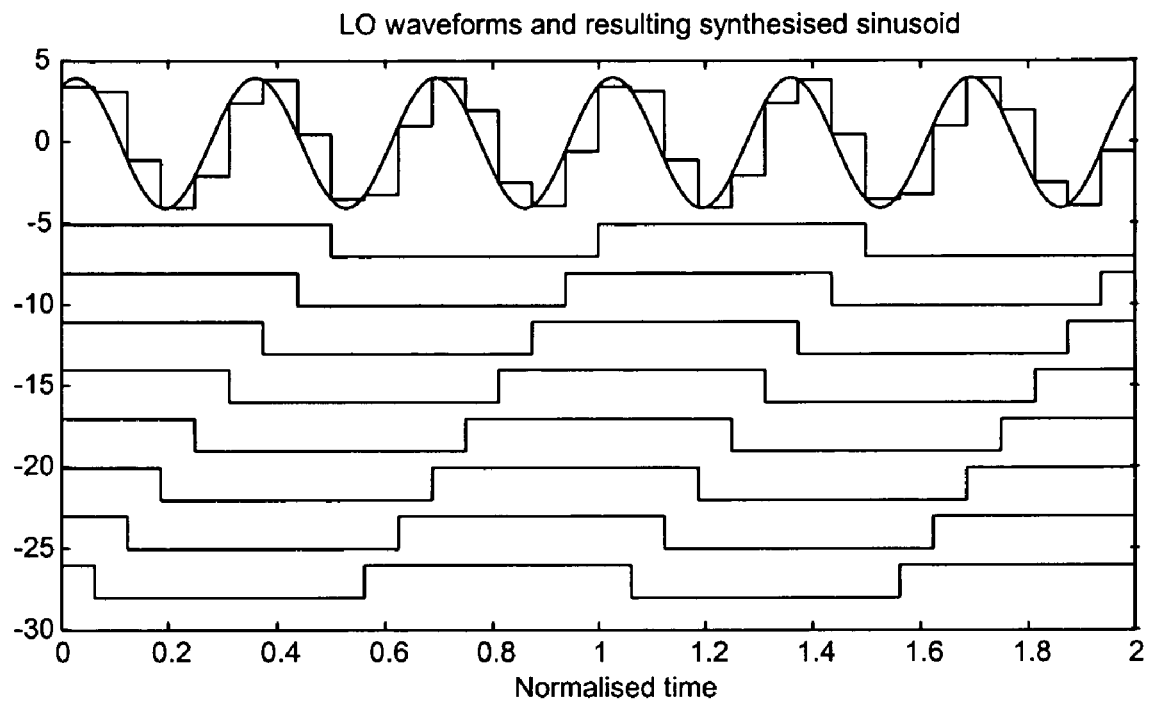
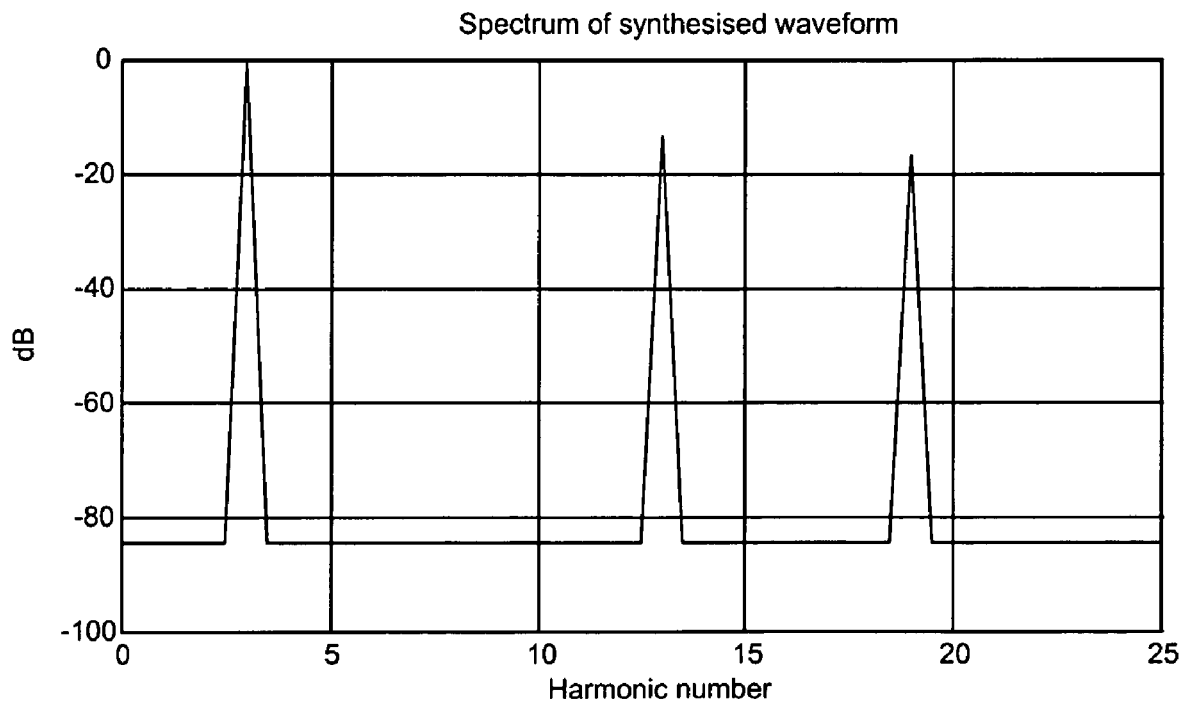

FIG. 9 4 phase, 1 cycle, I LO
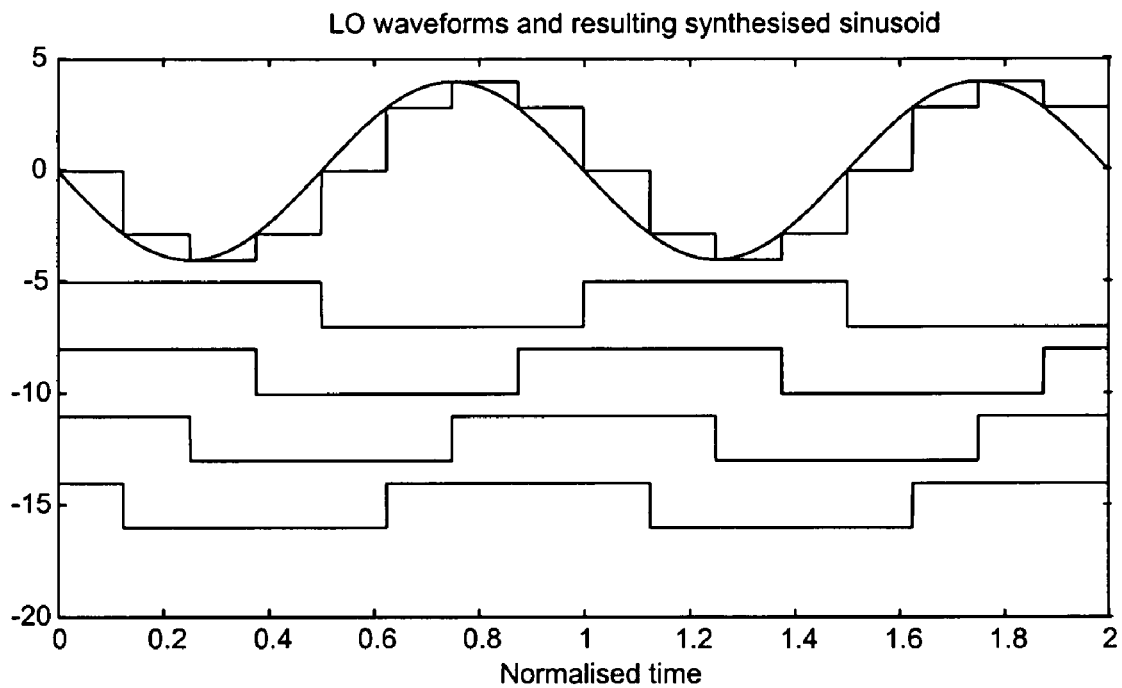
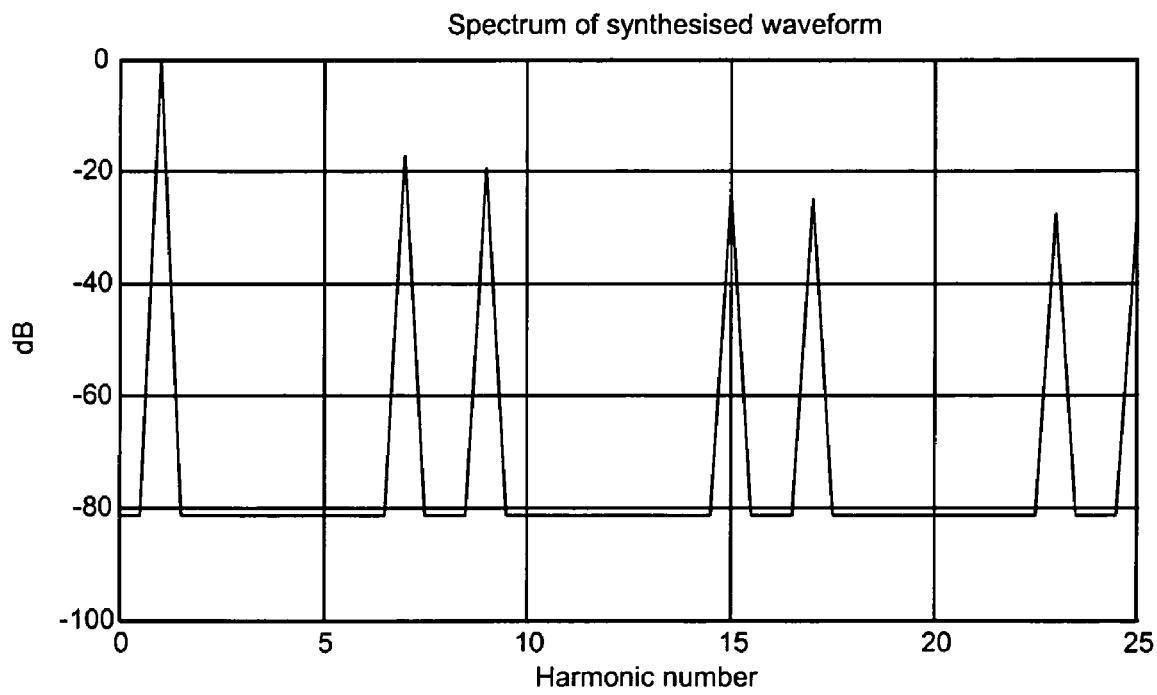

FIG. 10  4 phase, 1 cycle, Q LO
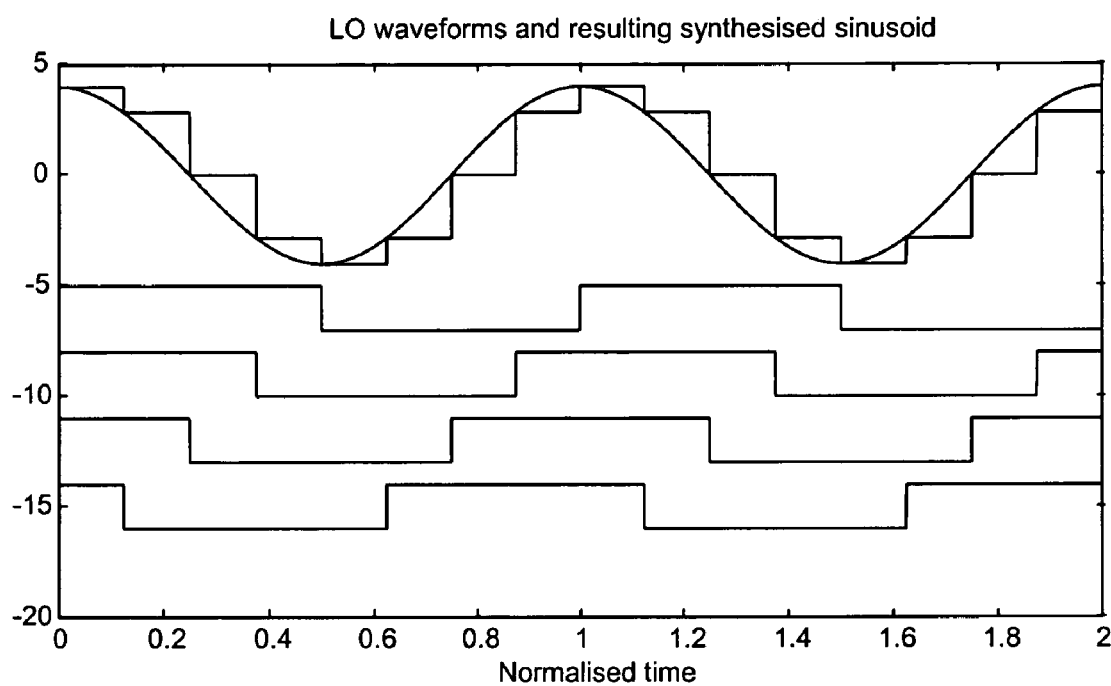
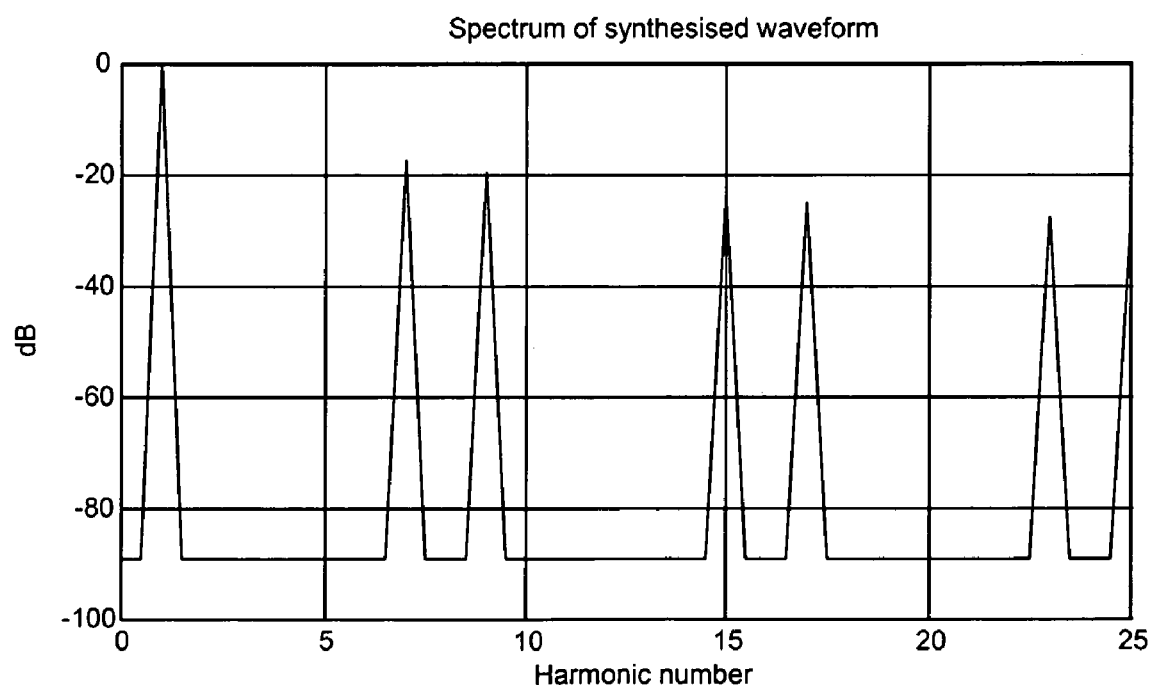

FIG. 11  2 phase, 1 cycle, I LO
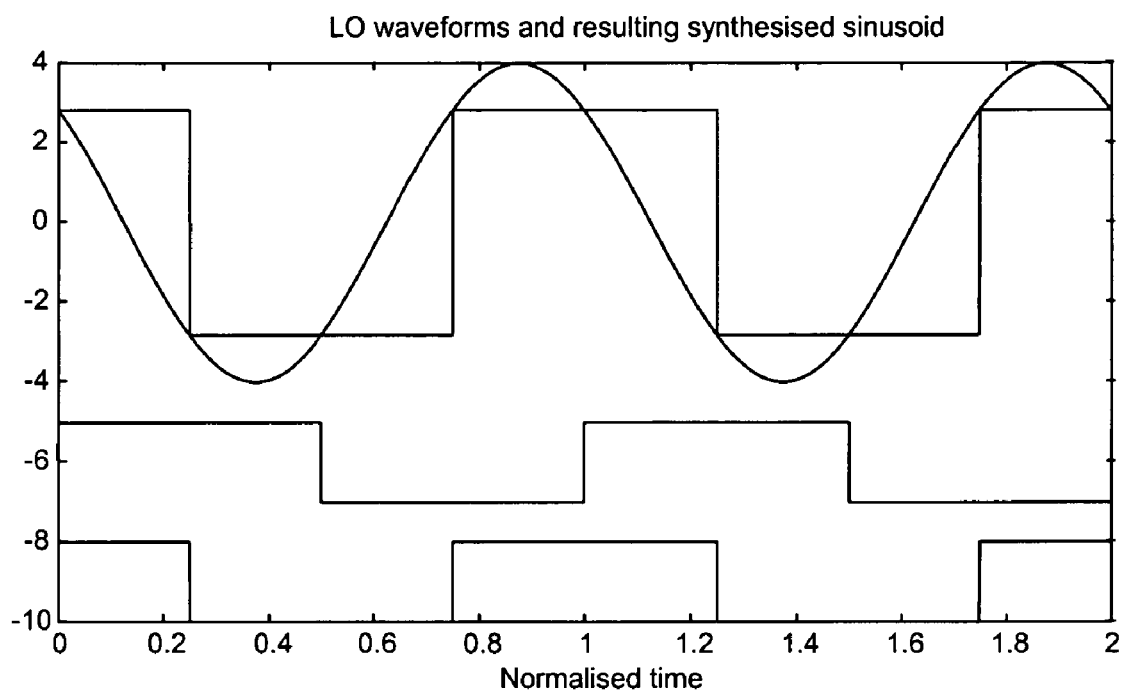
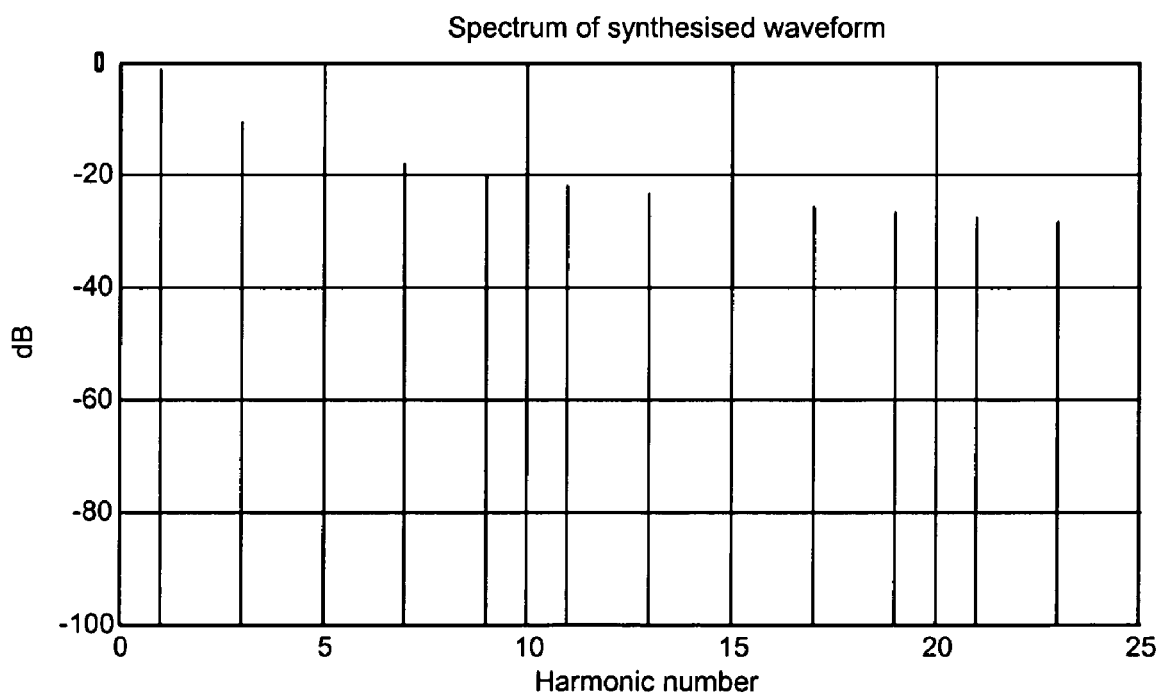

FIG. 12  2 phase, 1 cycle, Q LO
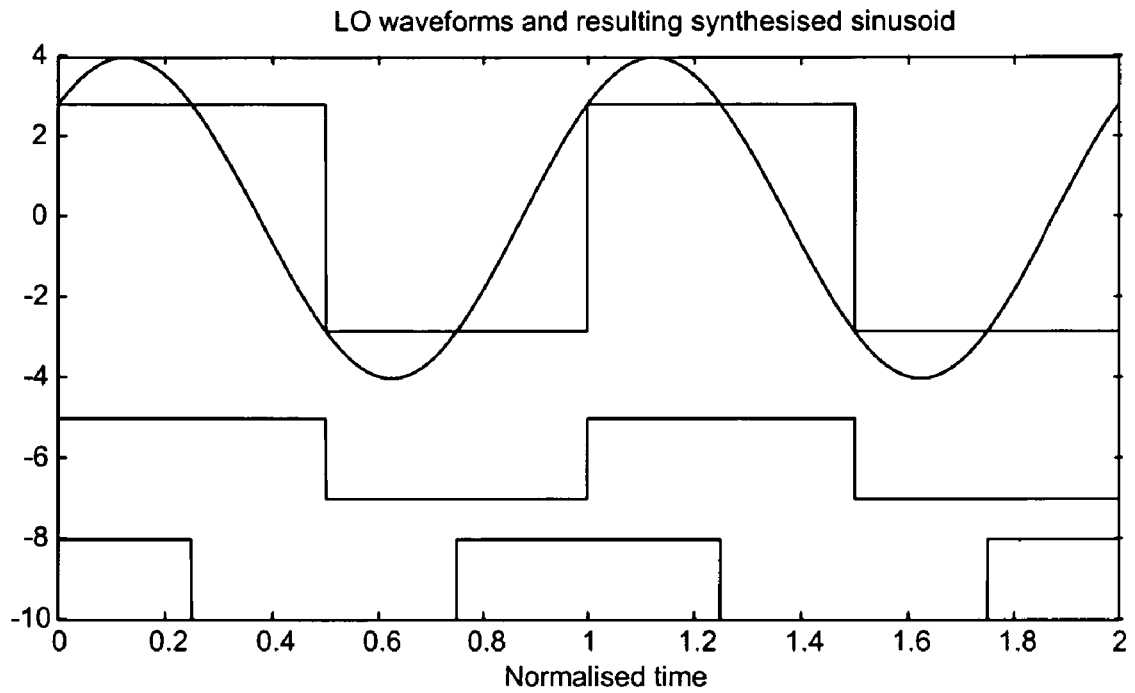
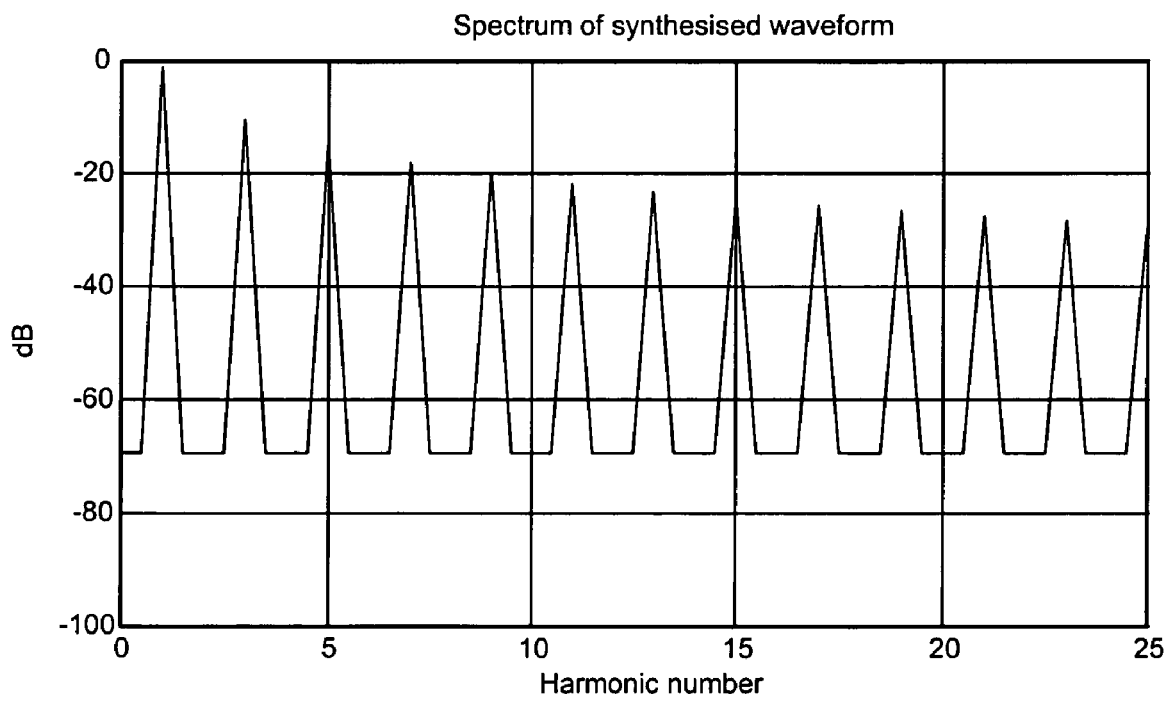

US 7,519,348 B2

HARMONIC SUPPRESSION MIXER AND TUNER

RELATED APPLICATIONS

This application claims priority from U.S. provisional application No. 60/552,864 filed Mar. 12, 2004 entitled "Harmonic suppression mixer and tuner", incorporated herein by reference.

This application claims priority from U.S. provisional application No. 60/636,584 filed Dec. 16, 2004 entitled "Phase-accurate multi-phase wide-band Radio Frequency Local Oscillator generator", incorporated herein by reference.

BACKGROUND

1. Field of the Invention

This invention relates to radio frequency mixers and particularly to mixers for suppressing harmonic conversion signals used in radio frequency tuners.

2. Prior Art

A mixer performs a combining operation on two input signals to create an output signal. In radio frequency (RF) applications, a local oscillator (LO) input signal mixes with the other input signal to achieve frequency translation, generally called up-conversion or down-conversion. In an up-conversion configuration, the input baseband signal is up converted to an intermediate frequency (IF) or RF signal, or an IF signal is up converted to an RF signal. In a down-conversion configuration, the input RF signal is down converted to an IF signal, or an IF or RF signal is down converted to a baseband signal. A baseband signal can be either a single real valued signal or a complex valued signal comprising an in-phase (I) and quadrature-phase (Q) signal. Conversion to or from a complex baseband signal requires two mixers, one mixer is driven by an in-phase LO and the other mixer is driven by a quadrature-phase LO. In the case of up-conversion, the other mixer ports are driven by the I and Q baseband signals, and the output of the two mixers is summed to create an IF or RF signal. In the case of down-conversion, the IF or RF input is split to drive two mixers, and the output of the two mixers produces the I and Q baseband signals.

A tuner is a combination of circuits used to select and down convert a single channel, or band of channels, from a wideband frequency division multiplex (FDM) channel. Examples of uses for tuners include over-the-air (OTA), satellite, and cable television receivers. A tuner selects a single TV channel, a narrow band, from the broadband RF spectrum, and outputs a band limited signal to a TV or to other circuitry for further processing.

A tuner uses various combinations of mixers, RF low noise amplifiers (LNAs), RF preselect filters, carrier tracking and other forms of frequency control, frequency synthesized LO or LO controlled by an automatic frequency control (AFC) loop, and filters to tune a selected channel.

Common tuner configurations include double conversion, single conversion, and direct conversion. A single conversion tuner, also called a heterodyne, converts the received RF signal to an IF signal using an LO frequency that is the sum or difference between the RF and IF signal frequencies. The IF signal is down converted to a baseband signal outside of the tuner for demodulation or can be demodulated directly from the IF signal. A double conversion tuner converts the incoming RF signal to a first IF signal, followed by a second conversion to a second IF signal or to a baseband signal. The second IF signal is demodulated or down converted to a baseband signal outside of the tuner. A direct conversion tuner, also called a homodyne, converts the RF signal directly to baseband using an LO frequency that is the same as the RF signal frequency.

Prior art tuners are described in the following references, each is incorporated herein by reference: Birleson et al., U.S. Pat. No. 6,177,964, issued Jan. 23, 2001, entitled "Broadband integrated television tuner", which discloses an up-conversion mixer and a down-conversion mixer in series to convert an RF signal to an IF signal; Rotzoll, U.S. Pat. No. 5,737,035, issued Apr. 7, 1998, entitled "Highly integrated television tuner on a single microcircuit", which discloses a receiver using an up-conversion mixer and a down-conversion image rejection mixer in series to produce an IF signal.

To avoid degrading the signal that is processed by the tuner, the mixers should have low noise characteristics. Two common types of mixers are used in tuners: multiplying mixers and switching mixers. Multiplying mixers produce an analog output from analog inputs; the two inputs are multiplied linearly to produce the output. Switching mixers are not linear due to discontinuously switching the input signal with the LO to produce the output. Multiplying mixers have higher in-band noise, while switching mixers have lower noise but have strong gain at harmonics of the LO frequency, specifically odd harmonics due to the square wave switching action. The harmonic conversion gain is undesirable in broadband systems such as TV because interfering signals could reside at frequencies that are converted by the LO harmonics to the output frequency of the channel of interest. The harmonic interferers could be other TV channels, resulting in interference into the tuned channel.

Prior art mixers are disclosed in the following references, each incorporated herein by reference: Somayajula, U.S. Pat. No. 6,560,451, issued May 6, 2003, entitled "Square wave analog multiplier", which discloses square wave analog mixer embodiments for heterodyning operation; Filoramo et al., U.S. Pat. No. 6,433,647, issued Aug. 13, 2002, entitled "Low noise I-Q mixer", which discloses a low-noise quadrature phase I-Q modulator having a pair of Gilbert cell stages driven by a square wave LO. Atherly et al. U.S. Pat. No. 5,140,198, issued Aug. 18, 1992, entitled "Image canceling mixer circuit on a integrated circuit chip", which discloses doubly balanced mixers injected with quadrature phase LO, followed by another 90 degree phase shift at the output of one mixer and summing of the two mixer outputs in order to reject one of the mixing terms.

One approach to solving the harmonic conversion problem is the use of harmonic-rejection mixers. This approach has been described in Weldon et al., "A 1.75-GHz highly integrated narrow-band CMOS transmitter with harmonic-rejection mixers", IEEE Journal of Solid-state circuits, Vol. 36, No. 12, December 2001. This paper described the use of a harmonic-rejection mixer in a transmitter. The harmonic-rejection mixer described uses a 3-bit amplitude quantized sinusoid for the LO. This shifts the harmonics of the LO to 7 times the LO frequency, relaxing the post mixing filter requirements. The sinusoid approximation is formed by using phase-shifted square waves to drive 3 mixers with weighted current drive, and the outputs are current summed to produce the composite mixer output. A separate group of mixers is used for the I and Q components of the signal. This mixer architecture configured for up-conversion in a transmitter and is not suitable for use to down convert an RF or IF signal to a complex baseband signal.

SUMMARY OF THE INVENTION

The present invention uses a plurality of switching mixers to form a harmonic suppression mixer for down-conversion of an RF signal into an I and Q output. The harmonic suppression feature suppresses higher frequency signals that would interfere with the desired tuning frequency. A series of staggered digital signals drives the LO port of each mixer. The RF port of each mixer is driven with the same signal or a separately buffered proportional version of the input signal. Alternatively, signal division could be achieved by a resistive split of the input signal driving the mixer cores. A weighted sum of the individual mixer signals produces the harmonic suppression mixer output signal. The harmonic suppression mixer can be embodied in a monolithic integrated circuit along with other components of a complete tuner.

In the various configurations disclosed, each of the individual mixers is fed a signal that is proportional to the RF input signal; whether using buffers, resistive splits, straight connection, or other driving networks that couple the input signal to each of the mixers in the ratio desired.

Gain stages on the input or output or both of each mixer weight the signals prior to adding the plurality of mixer outputs at a summing node, which can be current or voltage summing. Gain values can range from less than one to more than one. The weighting produces a sinusoid response from the digital LO drive. In an embodiment, a single bank of mixers is used with two independent banks of gain stages coupled to the mixer outputs. The outputs of each bank of gain stages form the I output and Q output, respectively. Alternatively, two banks of mixers can be used, each having weighting coefficients on the outputs or the inputs or both. The summation of signals from several mixers can help to average non-ideal characteristics of the mixers caused by process variations. LO leakage caused by mismatches in each mixer can be reduced due to the statistical cancellation of variations. In addition, the summation can also cancel certain deterministic non-ideal properties. For example, if the mixers produce a systematic direct current (DC) offset or systematic $2^{nd}$ order intercept point (IP2), then this can be cancelled in the summation process.

In an alternate embodiment, the RF inputs can be weighted and the mixer outputs can be summed directly together or combinations of input and output weighting could be used. The weighting of mixer inputs can be accomplished by varying the transconductance parameter of the mixers, without the need for additional components.

A precision multiphase LO generator is used to produce the staggered LO digital signals, which can be square waves. In one embodiment, a state machine produces a plurality of staggered outputs that can be re-clocked by a register bank to reduce signal skew, providing a precise fractional LO cycle relationship. One embodiment of an LO generator operates at a clock frequency that is a multiple of the desired LO frequency to produce the multiphase LO square wave signals.

The present harmonic suppression mixer invention is suitable for use in a complete tuner where the tuning range may cover a frequency range spanning 50 MHz to 860 MHz, or wider. To facilitate this wide tuning range, the present invention can have reconfigurable coefficients and effective mixer combining. The number of independent mixers can vary from 8 or more, to 4, to 2 or any suitable number of mixers.

In an examplary embodiment, at low tuning frequencies, an 8-mixer configuration can be used to achieve good suppression of harmonic signals that are within the occupied band of TV signals to prevent interference from higher channels into the lower channels. At higher tuning frequencies, either the harmonics are outside the active band of TV signals or the harmonics can be suppressed by filtering in the tuner. Therefore, less harmonic suppression is needed in the mixer, and a 4 mixer or 2 mixer configuration can be used, which reduces the required frequency of the LO generator clock signals.

BRIEF DESCRIPTION OF THE DRAWINGS

FIG. 5 shows waveforms and resulting spectrum for an 8 phase 1 cycle I LO.

FIG. 6 shows waveforms and resulting spectrum for an 8 phase 1 cycle Q LO.

FIG. 7 shows waveforms and resulting spectrum for an 8 phase 3 cycle I LO.

FIG. 8 shows waveforms and resulting spectrum for an 8 phase 3 cycle Q LO.

FIG. 9 shows waveforms and resulting spectrum for a 4 phase 1 cycle I LO.

FIG. 10 shows waveforms and resulting spectrum for a 4 phase 1 cycle Q LO.

FIG. 11 shows waveforms and resulting spectrum for a 2 phase 1 cycle I LO.

FIG. 12 shows waveforms and resulting spectrum for a 2 phase 1 cycle Q LO.

DETAILED DESCRIPTION OF THE INVENTION

Figure 1:
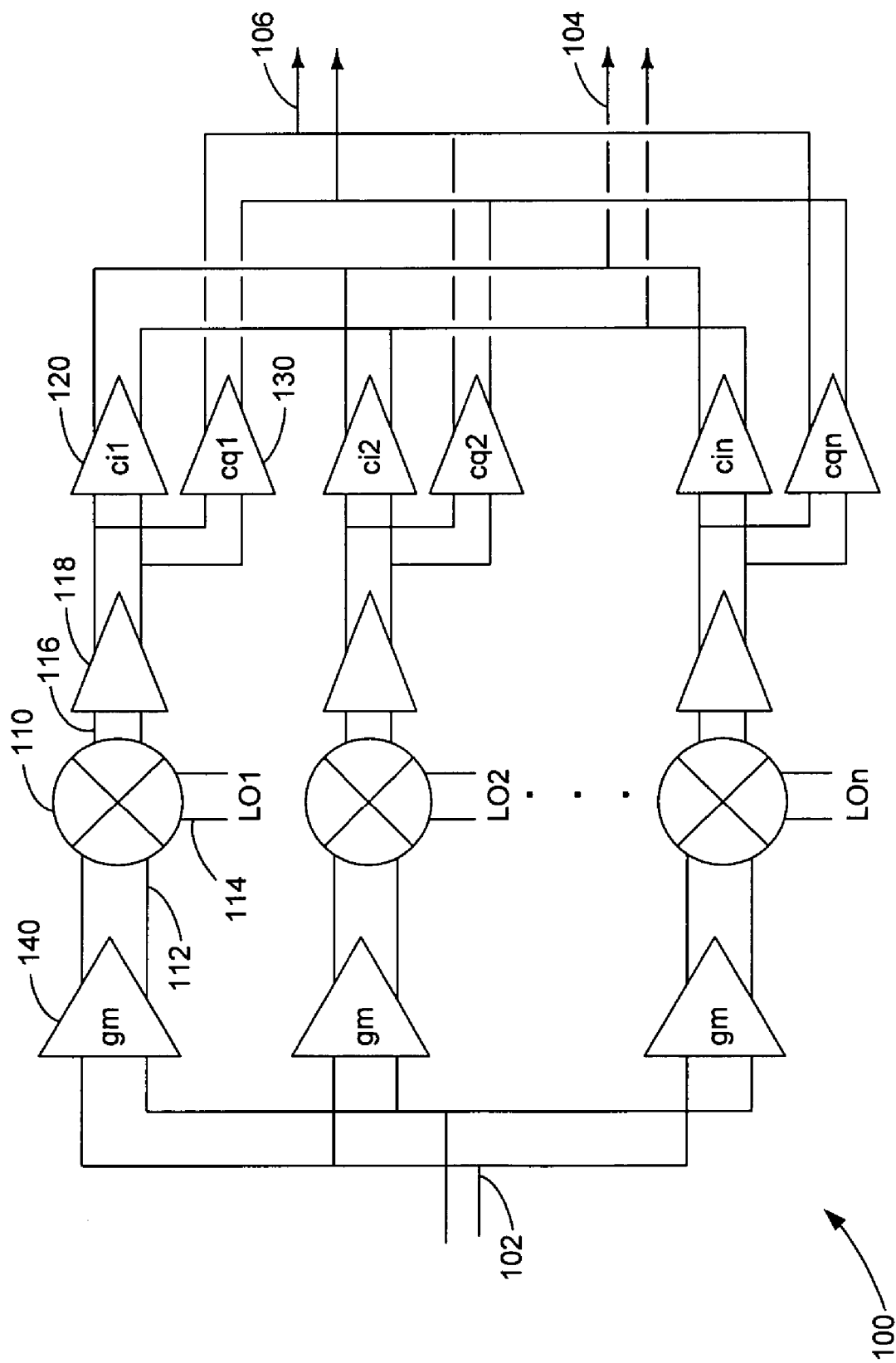
FIG. 1 shows a harmonic suppression mixer according to the present invention.

FIG. 1 shows harmonic suppression mixer 100 according to the present invention. Harmonic suppression mixer 100 has common input signal 102 that drives transconductance amplifiers 140 to provide signal isolation between each switching mixer 110. Transconductance amplifier 140 prevents the LO signal leaking at switching mixer 110 input from coupling to other mixers and to common input 102. LO signal leakage back to the common input tends to cancel each other due to LO phasing, thus amplifier 140 is optional. Transconductance amplifier 140 can be any type of amplifier depending on the signal type required at the input and output and each can have a different gain. Harmonic mixer 100 comprises multiple switching mixers 110, each with signal input 112, local oscillator (LO) input 114, and signal output 116. All signals are differential drive and can be Gilbert cell or other mixer topologies that are known. A bank of mixers is shown, for example comprising 8 mixers. LO signal 114 is driven by an LO generator, described below. The frequency of LO1 through LOn are identical and the phase is staggered by $1/(2*N)$ of the LO period, where N is the number of switching mixers 110 used.

Optional amplifier 118 can be a current, voltage, transimpedance, or transconductance amplifier, depending on the output type of the mixers and the input type of the coefficient stages.

Coefficient stages 120 and 130 provide gain of various magnitudes on each switching mixer 110 output. Coefficient stages 120 and 130 are well known and can be configured, for example, as current mirrors with gain and or as resistive summing networks, possibly using operational amplifiers. Using current mirrors, the current output of switching mixers 110 is reflected as a new current with gain equal to the desired coefficient value for the stage. Gain values can range from less than one to more than one. The current from all coefficient stages 120 is combined at a current summing node to form an in-phase (I) output signal 104. The current from all coefficient stages 130 is combined at a current summing node to form a quadrature-phase (Q) output signal 106.

Coefficient stages 120 and 130 have gain values that correspond to an equi-distant time sampled approximation of one half-period of a sine wave. More specifically, the coefficients are found by solving the following matrix equation (here shown for 4 LO phases):

$$\begin{vmatrix} s1 \\ s2 \\ s3 \\ s4 \end{vmatrix} = \begin{vmatrix} 1 & 1 & 1 & 1 \\ -1 & 1 & 1 & 1 \\ -1 & -1 & 1 & 1 \\ -1 & -1 & -1 & 1 \end{vmatrix} \begin{vmatrix} w1 \\ w2 \\ w3 \\ w4 \end{vmatrix}$$

where s1 . . . s4 are equi-distantly sampled points of one half-wave of the desired summation waveform, preferably a half wave of a sine wave.

When summed, the outputs produce the equivalent of a sinusoidal LO signal. A quadrature phase relationship is created in the coefficient values in coefficient stages 120 and coefficient stages 130 to produce a quadrature relationship in the I and Q outputs. For example, c(i)(n) has a value of cos (angle) and c(q)(n) has a value sin (angle), where n is the stage number and angle is pi*n*(1/N)+offset, where N is the total number of stages. The angle can be offset to avoid or achieve coefficient values of zero. Zero valued coefficients result in no contribution to the output signal, thus the corresponding circuitry can be eliminated, which is desirable in some applications for cost savings. Alternatively, an offset angle can be introduced to achieve minimum coefficient value spread, which offers better component matching and hence better suppression of the harmonics mixing and reduced silicon area.

Tables 1 through 4 show example sets of coefficients generating 8, 4 and 2 phase LO waveforms.

TABLE 1

| 8 phase 1 cycle LO, I (0 deg.) and Q (90 deg.) | | | | | | | |
|---|---|---|---|---|---|---|---|
| I: −0.191342 | −0.162212 | −0.108386 | −0.0380602 | 0.0380602 | 0.108386 | 0.162212 | 0.191342 |
| Q: 0.0380602 | 0.108386 | 0.162212 | 0.191342 | 0.191342 | 0.162212 | 0.108386 | 0.0380602 |

TABLE 2

| 8 phase 3 cycle LO, I (30 deg.) and Q (120 deg.) | | | | | | | |
|---|---|---|---|---|---|---|---|
| I: −0.245722 | 0.366313 | 0.526086 | 0.036336 | −0.498276 | −0.4177 | 0.178582 | 0.554381 |
| Q: 0.498276 | 0.4177 | −0.178582 | −0.554381 | −0.245722 | 0.366313 | 0.526086 | 0.036336 |

TABLE 3

| 4 phase 1 cycle, I (0 deg.) and Q (90 deg.) | | | |
|---|---|---|---|
| I: | −0.353553 | −0.146447 | 0.146447 | 0.353553 |
| Q: | 0.146447 | 0.353553 | 0.353553 | 0.146447 |

TABLE 4

| 2 phase 1 cycle LO, I (45 deg.) and Q (135 deg.) | |
|---|---|
| I: | 0 | 1 |
| Q: | 1 | 0 |

While this example has been described using current switching mixers and current gain stages, the design can alternatively be implemented with voltage driven devices such as op-amp based summing circuits. In one embodiment, current-switching mixers are used with voltage-mode (op-amp-based) summing circuits.

The coefficients can be selected using programmable circuit techniques. A programmable current mirror stage uses switches to connect parallel MOSFET output branches. A programmable op-amp stage uses switches to connect in different gain setting resistors.

The harmonic suppression mixer is configured for 8, 4, or 2-mixer operation by changing coefficient values. In the 4 and 2 mixer configurations, mixers are programmed with duplicate coefficient values to reduce the number of unique effective mixers. The configuration of LO signals driving the mixers can also change, including LO signals being identical to each other, resulting in 4 or 2 unique phases. Although 8 mixers and LO signals are shown, any number of mixers and LO phases can be used as required for an application, including odd numbers.

Other embodiments include an input configuration where the input current to the mixer core is obtained by connecting resistors from the common RF input voltage into each of the mixer cores; this also achieves the desired voltage-to-current transformation. In another embodiment, all the mixer core inputs are connected together and the RF input current splits evenly between each mixer.

Figure 2:
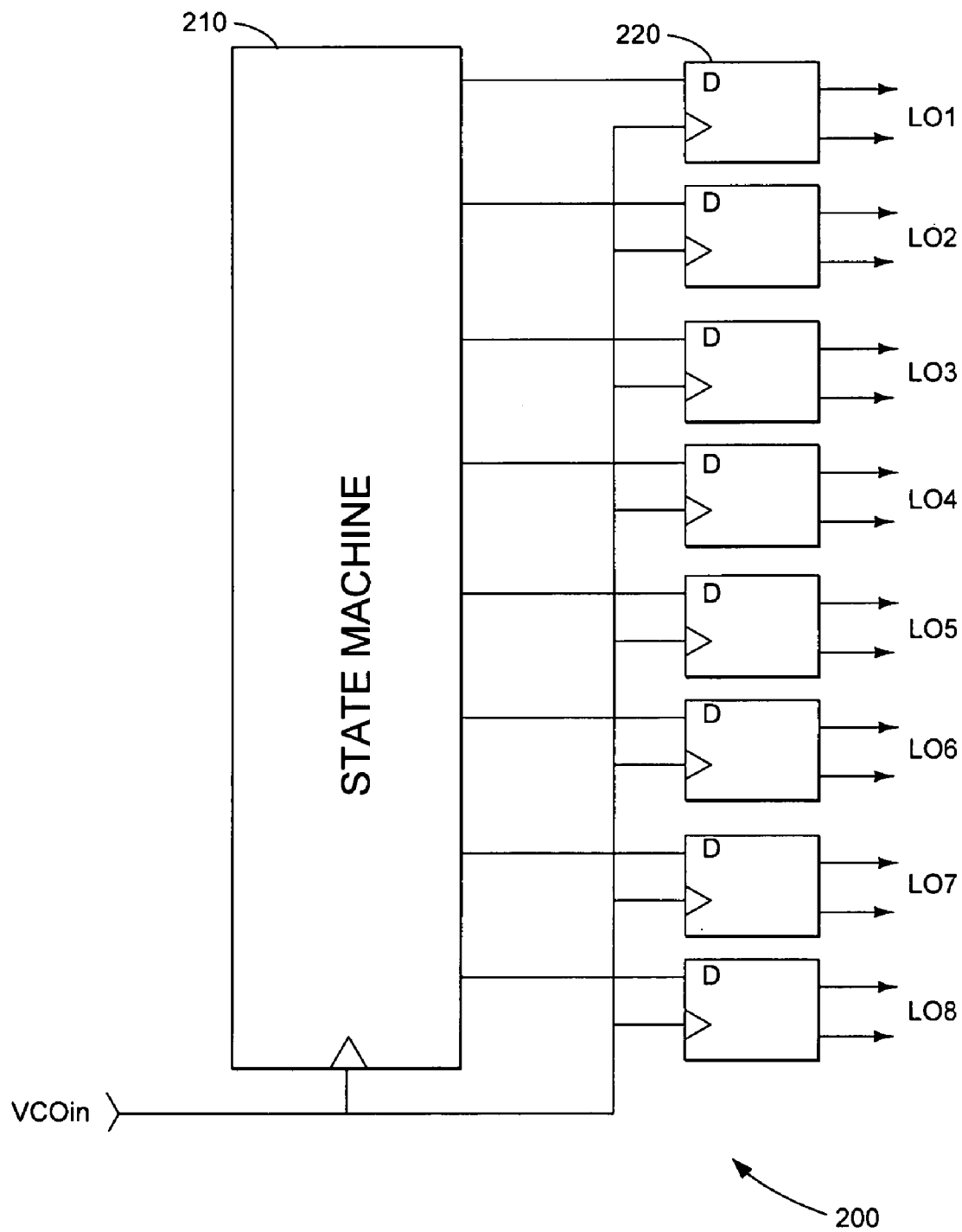
FIG. 2 shows a staggered square wave LO generator.

FIG. 2 shows an example LO generator 200 for use with the harmonic suppression mixer. Relative phase accuracy and low jitter of each LO is important to achieving low conversion gain of RF interferers occurring at harmonics of the LO and good reciprocal mixing performance of the harmonic suppression mixer. State machine 210 produces a series of square wave digital signals shifted by 1/(2*N) fraction of the LO period, where N is the number of LO signals generated. Registers 220 re-clock the output of state machine 210 to insure that the transition of each square wave occurs at the precise relative time. Registers 220 and state machine 210 are driven by a high frequency clock that is, for example, 4 times the LO frequency and can range from 1 to 8 times the LO frequency. Reclocking the output of the state machine is optional.

The state machine is reconfigurable to give LO phases that are staggered at 1/(2*8), 1/(2*4), or 1/(2*2) of a period depending on the frequency of the desired channel. In each configuration, 8 mixers are used, but in the 1/(2*4) and 1/(2*2) modes the mixer output coefficients are changed such that they correspond to a full-wave sampled sine-wave in the 1/(2*4) case or to sampling two cycles of a sine-wave in the 1/(2*2) case. This way, by parallel action, the 8 mixers effectively collapse to four unique mixers in the 1/(2*4) case or to two unique mixers in the 1/(2*2) case. The clock frequency multiple relative to the LO frequency needed for the LO generator is reduced in the four mixer and two mixer configurations. At the higher tuning frequencies where the four and two mixer configurations are used, harmonic signals are out of band or are removed by filtering operations in the tuner signal processing circuitry feeding the mixer.

Figure 3:
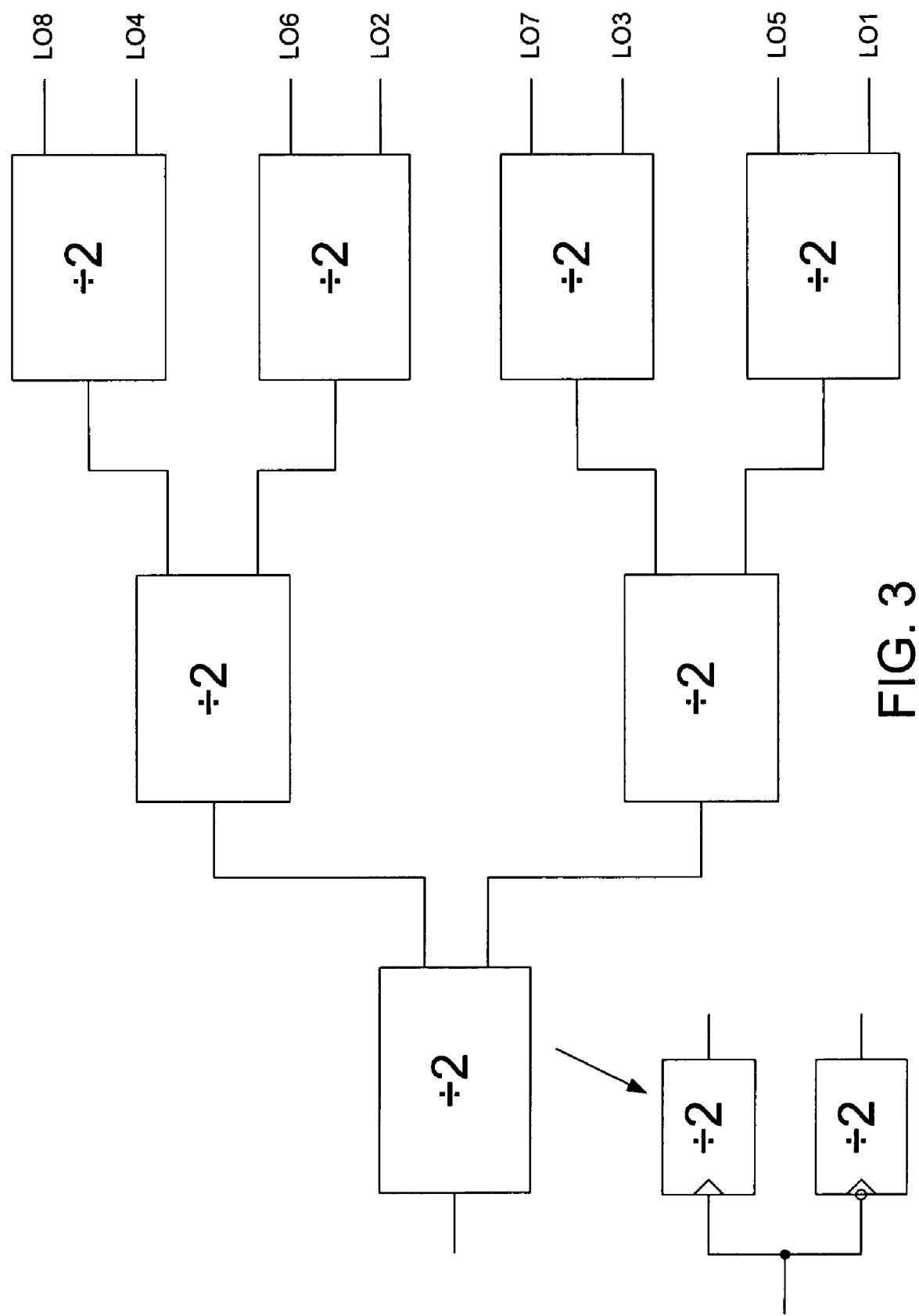
FIG. 3 shows the state machine component of the LO generator.

FIG. 3 shows details of an example state machine 210. Ripple dividers operate on alternate phases of the clock input to divide the clock input by two and produce quadrature phase outputs to drive a successive stage. Some skew and random variation in switching time is introduced by each stage. Registers 220 can be used to re-clock the state machine output to align the LO signal edges.

Another embodiment of the LO generator generates rectangular digital signals that vary in pulse width or duty cycle to produce signals with staggered edges to drive the mixers. For example, the digital signals can have a periodic pulse width varying from one-eighth period to seven-eighths period in one-eighth period increments. The centers of each pulse can be aligned.

Other approaches to implementing state machine 210 include Moore machine architecture, Mealy machine architecture, one-hot encoding, and other well known state machine architectures. In each case, a second level of registers can be used to de-skew the state machine outputs.

Figure 4:
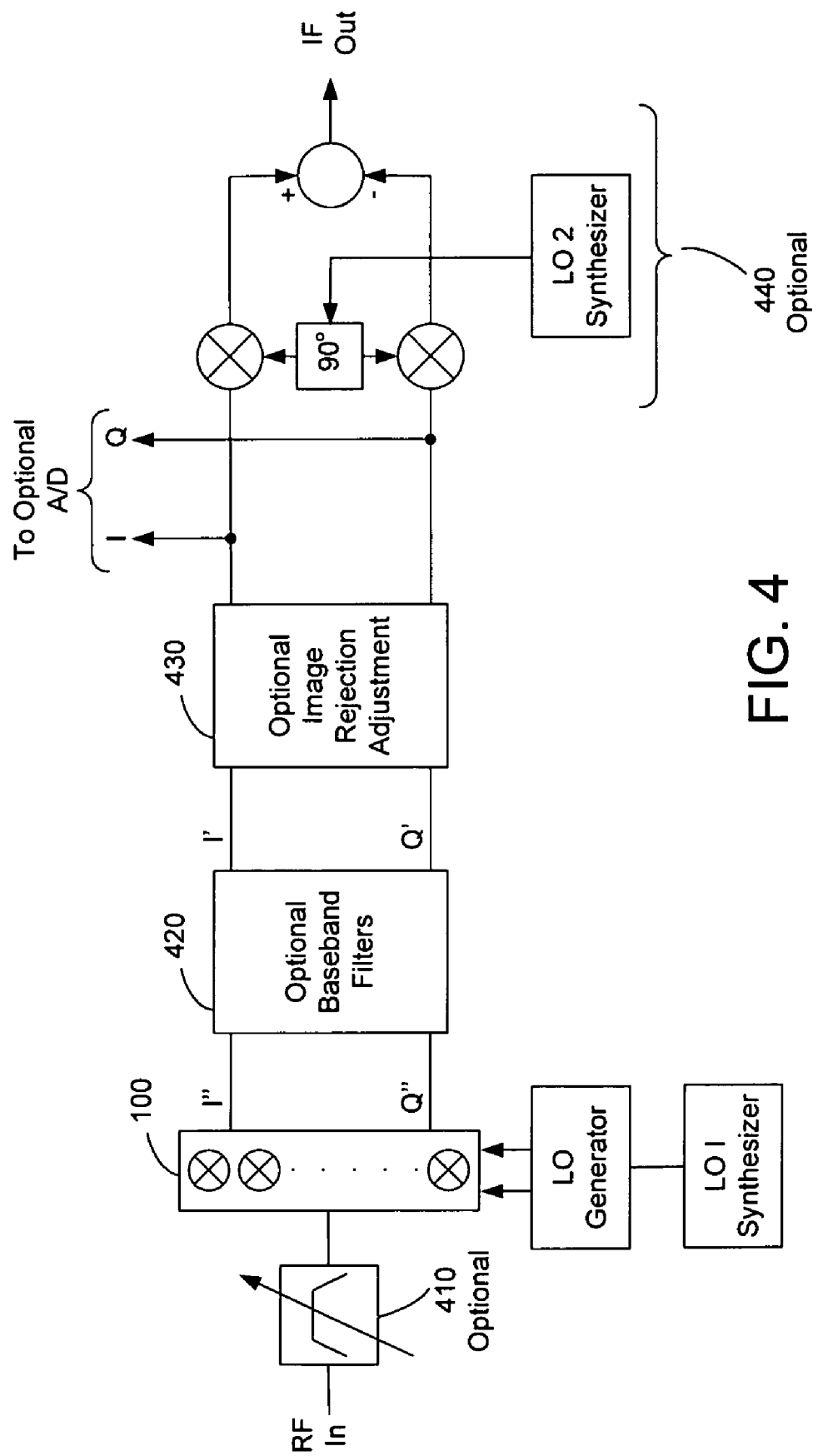
FIG. 4 shows a tuner employing the harmonic suppression mixer.

FIG. 4 shows an example block diagram of a direct down-conversion tuner using the harmonic suppression mixer. An optional variable band pass or low pass filter 410 preselects the channel for tuning. The harmonic suppression mixer 100 outputs an I and Q signal to baseband filters 420. An optional image rejection adjustment stage 430 balances I and Q signals for complete image rejection. The tuner output can be taken in analog I/Q form, digitized by A/D converters, or mixed and combined by a quadrature modulator 440 to produce an IF signal output. A quadrature combiner can be used in place of a quadrature modulator. Alternatively, each mixer output can be digitized and the combining performed in the digital domain.

I and Q signal band limiting filters can be implemented with two separate real valued filtered or as a complex filter operating on I and Q signals jointly, including cross rail filters. The I and Q band limiting can be performed on baseband or IF signals.

In an alternate tuner architecture, not show, RF input signal level is reduced by an optional attenuator when used for over the air (OTA) applications. An optional diplexer divides the received frequency band into subbands for filtering by optional tunable preselect filters, typically one each for low-VHF, high-VHF, and UHF. The tunable preselect filters provide additional harmonic suppression in addition to suppression provided by the mixer. Tunable preselect filters also greatly improve distortion performance because out of band interferers are attenuated. If distortion is less critical, fixed filters can be used. For less demanding applications, a wideband amplifier can be used without filters. Harmonic suppression is provided primarily by the mixer. Alternatively, the amplifier can be eliminated and the signal driven directly into the mixer. An optional single-ended to differential conversion is used to drive the differential harmonic suppression mixer. Alternatively, a single-ended signal path can drive a single-ended mixer. The present mixer invention can be implemented with single-ended or differential circuits, or a combination of single-ended and differential circuits.

I and Q outputs of the harmonic suppression mixer drive baseband filters that reject down converted interferers as well as mixer product terms and the LO signal. An image rejection adjustment stage balances the I and Q signal levels and phase for complete image rejection. A technique for calibrating I and Q balance is disclosed in Der, L., Razavi, B., "A 2-GHz CMOS image-reject receiver with LMS calibration", IEEE Journal of Solid-State Circuits, Volume 38, Issue 2, February 2003, pages 167-175. In general image rejection circuits can perform amplitude correction, phase correction, or both. Image rejection circuits can operate at either baseband or IF.

Another technique that guarantees high image rejection uses a double I/Q down-conversion, but this technique is more complex, consumes more power, and is more noisy; however no calibration step is required. This technique is described in Crols, J., Steyaert, M. S. J., "A single-chip 900 MHz CMOS receiver front-end with a high performance low-IF topology", IEEE Journal of Solid-State Circuits, Volume 30, Issue 12, December 1995, pages 1483-1492.

An image rejection circuit is described in copending U.S. provisional patent application entitled "In-phase and quadrature-phase signal amplitude and phase calibration", filed Dec. 15, 2004, Ser. No. 60/636,383, incorporated herein by reference.

The adjusted I and Q signals drive an IF up-converter that produces an IF signal of suitable frequency, for example 5 MHz, 36 MHz, 44 MHz, 57 MHz, or 63 MHz. Additionally, the IF signal can be digitized. Baseband I and Q outputs can be driven externally, as either analog signals or digitized signals, for systems that perform digital signal processing on the received signal. Alternative configurations include: RF conversion to a high frequency IF signal using a conventional mixer, bandpass channel filtering, then downcoversion to baseband using a harmonic suppression mixer, then digitize and output; RF down-conversion to a low IF, for example 5 MHz, with a harmonic rejection mixer followed by a I and Q quadrature combiner then digitize and output.

A phase locked loop (PLL) frequency synthesizer produces a signal to drive the LO generator. The voltage controlled oscillator (VCO) output of the PLL circuit operates at a multiple of the LO generator frequency, therefore some design consideration is needed to reduce the maximum frequency of the VCO operation. Table 6, below, shows tuner operating frequency ranges along with the mixer configuration and required VCO frequencies. In Option 1, the mixer operates with a single cycle LO. The number of LO phases is decreased as the final LO increases. Option 2 minimizes the range of operation of the VCO. Option 3 optimizes harmonic rejection at each tuner range. A divider on the VCO output is selected to divide the VCO for use in the LO generation to reduce the range of variation of the VCO operation.

The harmonic suppression mixer can be used as an RF to IF mixer, where the LO frequency is set to produce an IF frequency at the I and Q outputs. A polyphase filter can combine the I and Q outputs and provide a single conversion from RF to IF with or without image rejection. The IF signal can be any frequency, for example 36 MHZ, 44 MHz, 57 MHZ, 63 MHz or higher. The IF frequency can be a low-IF frequency, for example 4 MHz. A further alternative harmonic suppression mixer uses a single mixer bank and a single IF output instead of I and Q outputs. System configurations using the harmonic suppression mixer include RF to IF with image rejection, RF to IF without image rejection, and RF to baseband.

FIGS. 5 through 12 show waveform and spectrum plots for several configurations of the harmonic suppression mixer using 8 phase, 4 phase, and 2 phase LOs. The figures show the relative frequency of the tuned signal and the nearest harmonic conversion frequencies.

Figure 13:
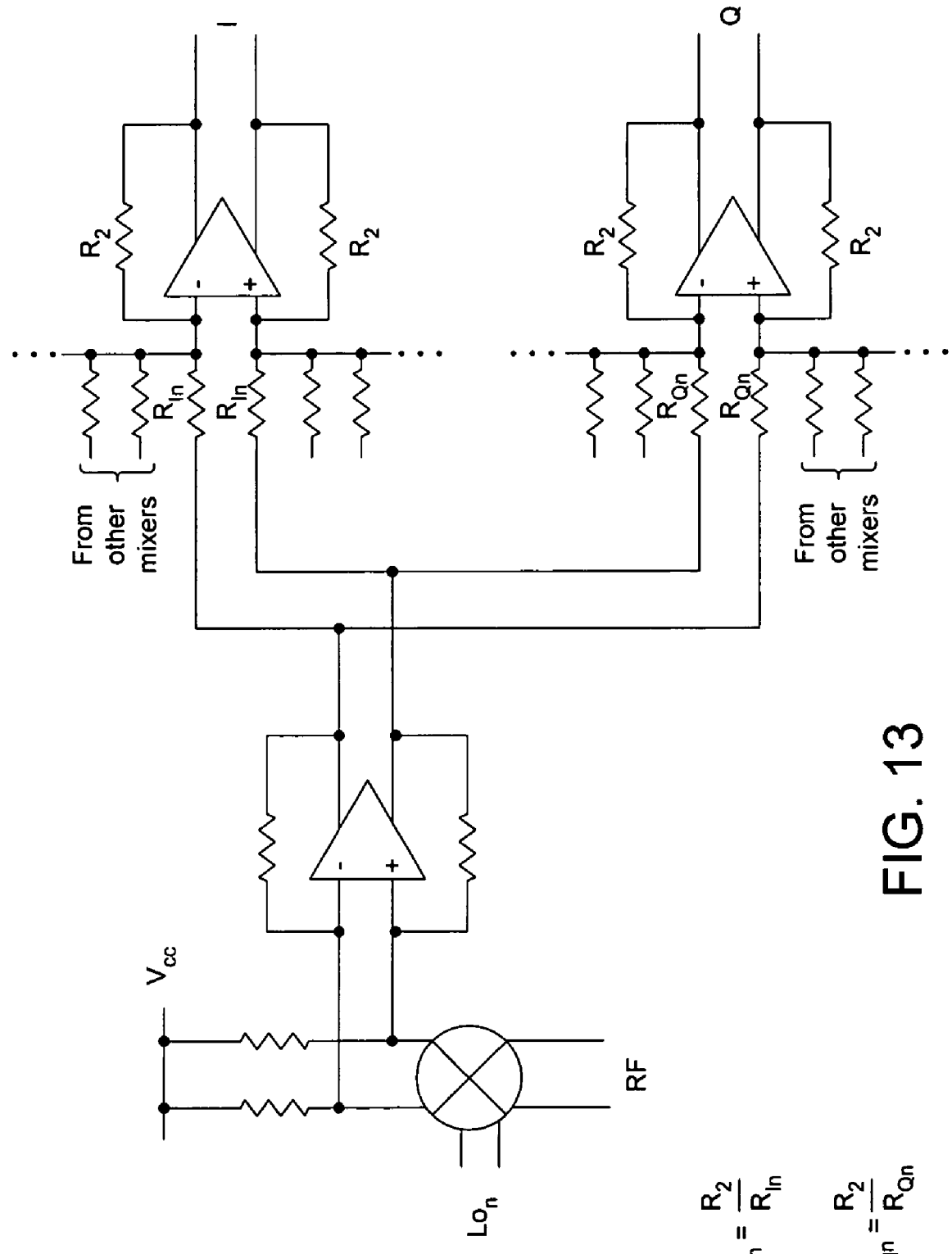
FIG. 13 shows a schematic diagram of a resistive summing stage for use with the harmonic suppression mixer.

FIG. 13 shows an example resistive summing stage for combining the output from mixer stages. The gain coefficient for each mixer is set by the input resistors driving the summing node at the op-amp input. Each resistor can be fixed or a programmable value. In one embodiment, the differential transimpedance amplifier can be removed, leaving only resistance to passively connect the mixer output to the summer. Alternatively, well known current summing stages can be used instead of voltage summing.

Figure 14:
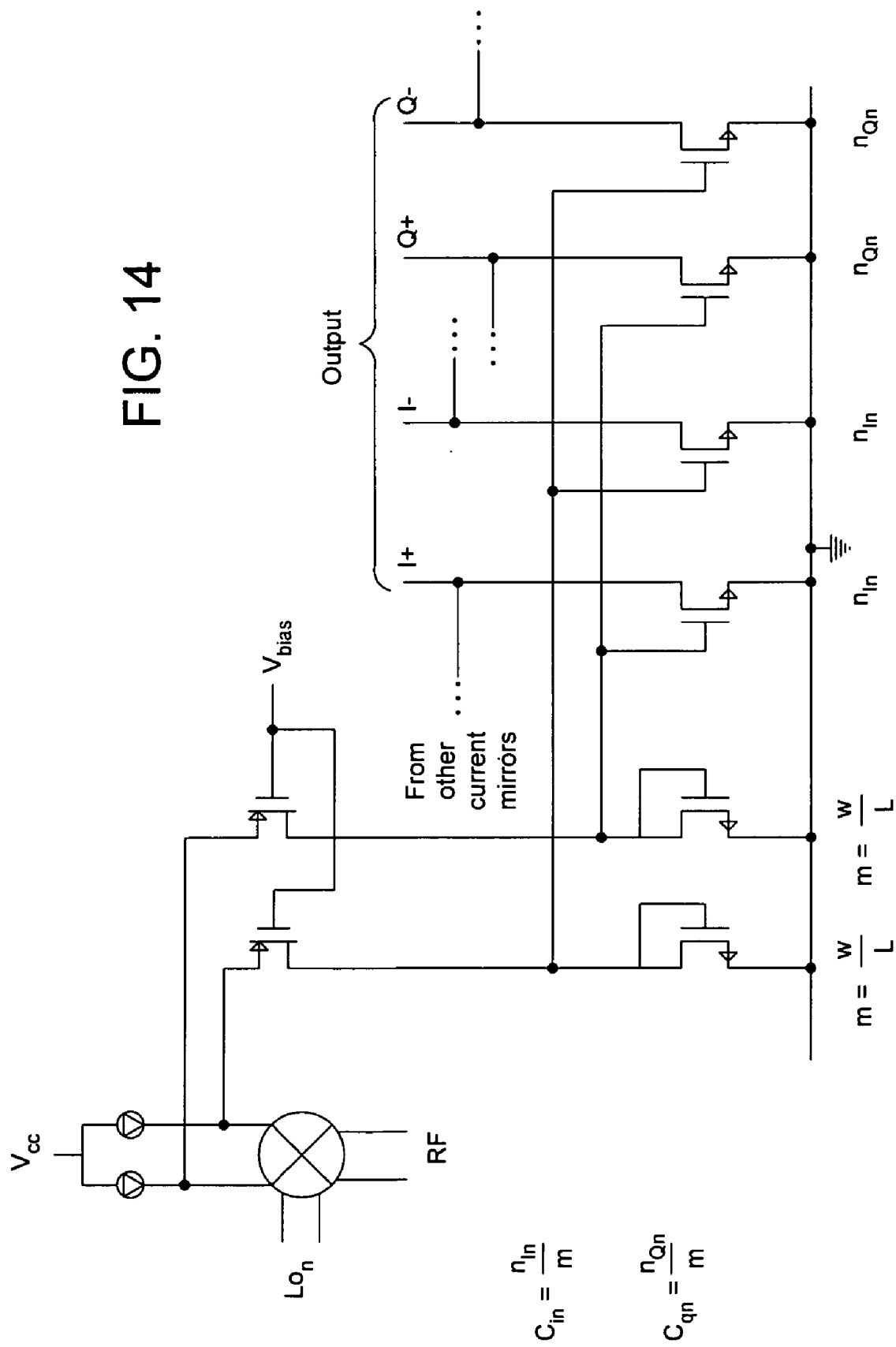
FIG. 14 shows schematic diagram of a current mirror summing stage for use with the harmonic suppression mixer.

FIG. 14 shows a current mirror summing stage for combining the output from mixer stages. The gain coefficient for each mixer is set by the characteristics of the MOSFETs in the current mirror. The input transistors have an aspect ratio m=W/L; where W is the channel width and L is the channel length. The output transistors have an aspect ratio n=W/L, using different W and L from the input transistors. The ratio n/m determines the current gain. Each current ratio can be fixed or programmable. In one embodiment, the value of m is fixed and the value n is varied to achieve different coefficients. The output signals at I+/− and Q+/− are also summing nodes for current signals produced by other mixer stage current mirrors.

Figure 15:
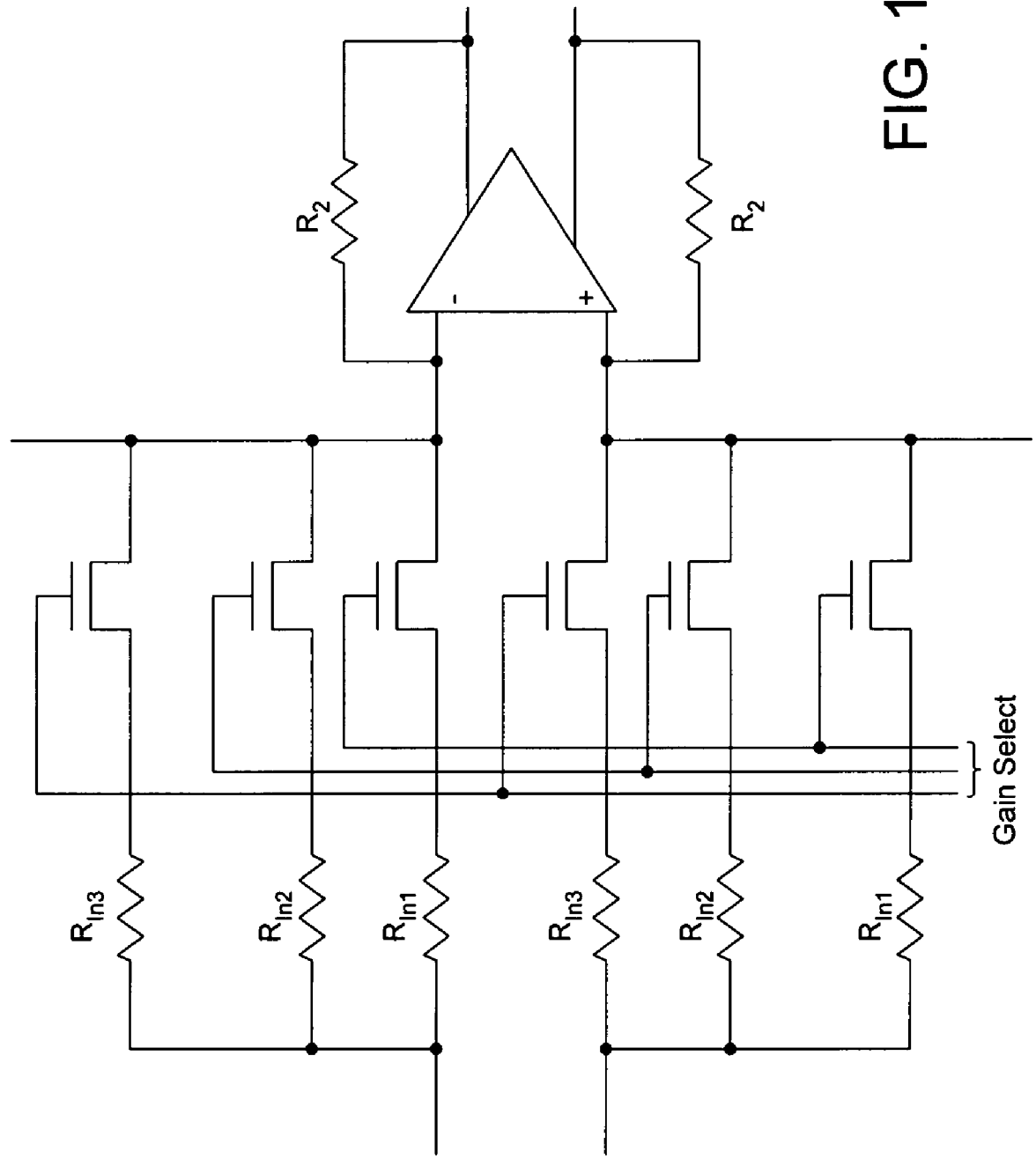
FIG. 15 shows detail of a programmable coefficient for a resistive summing stage.

FIG. 15 shows detail of an example programmable resistor values for a resistive summing stage. A switching transistor controlled by a gain select signal connects one or more resistors to the op-amp summing node. The switch is placed at the summing node side of the resistor because a virtual ground exists at this point and therefore the switch does not experience a change in voltage potential as the input signal varies. One resistor can be directly connected to the summing node without a switch for a fixed minimum gain. Progammable gain can alternatively be implemented using a field effect transistor (FET) with a variable applied gate voltage in place of the switching transistor to produce a variable resistance value.

Figure 16:
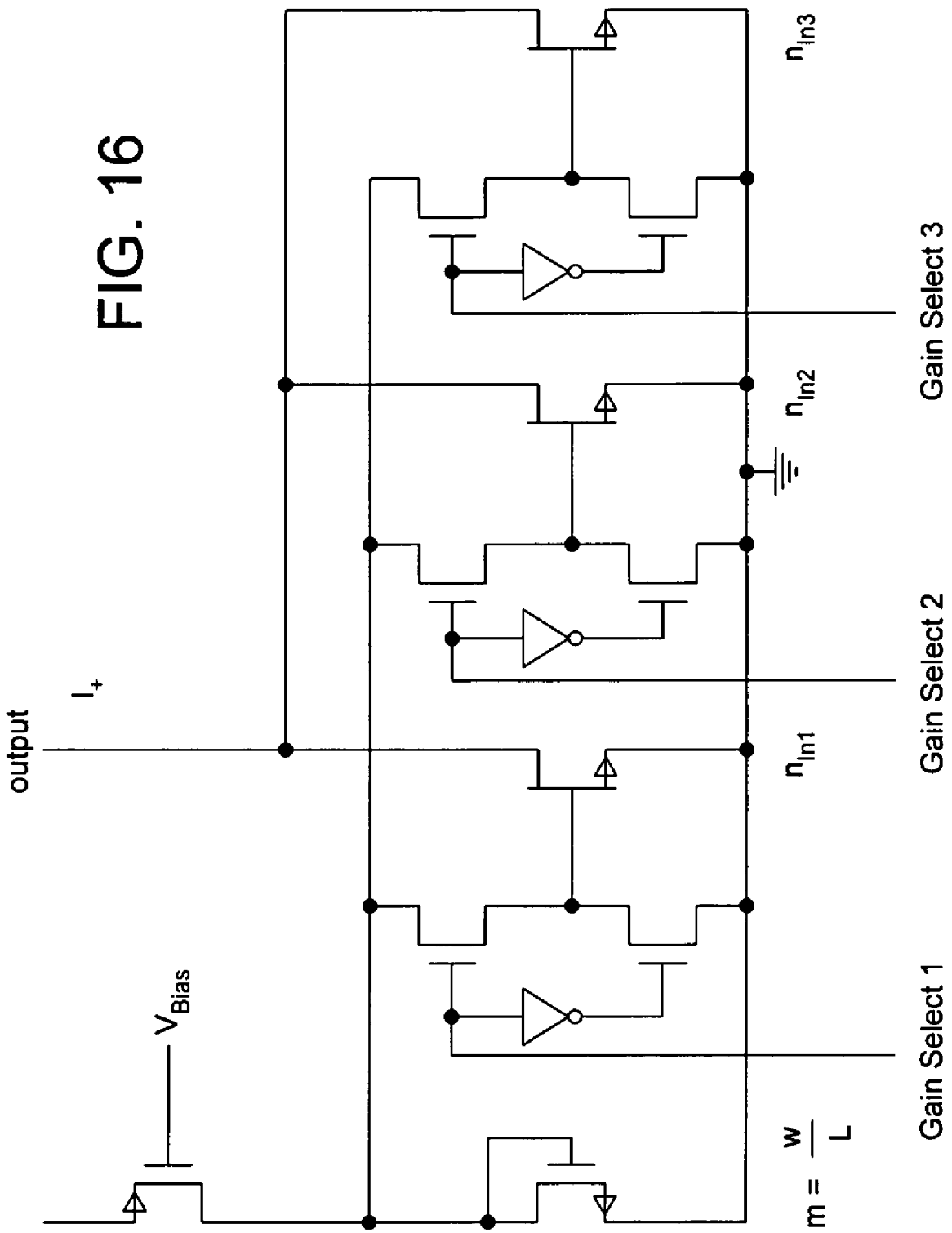
FIG. 16 shows detail of a programmable coefficient for a current mirror summing stage.

FIG. 16 shows detail of a programmable current mirror for a current summing stage. A switch connects one or more output transistors to the output summing node. Each output transistor is connected to either the gate drive signal from the input transistor or to ground using a gain select signal.

Figure 17:
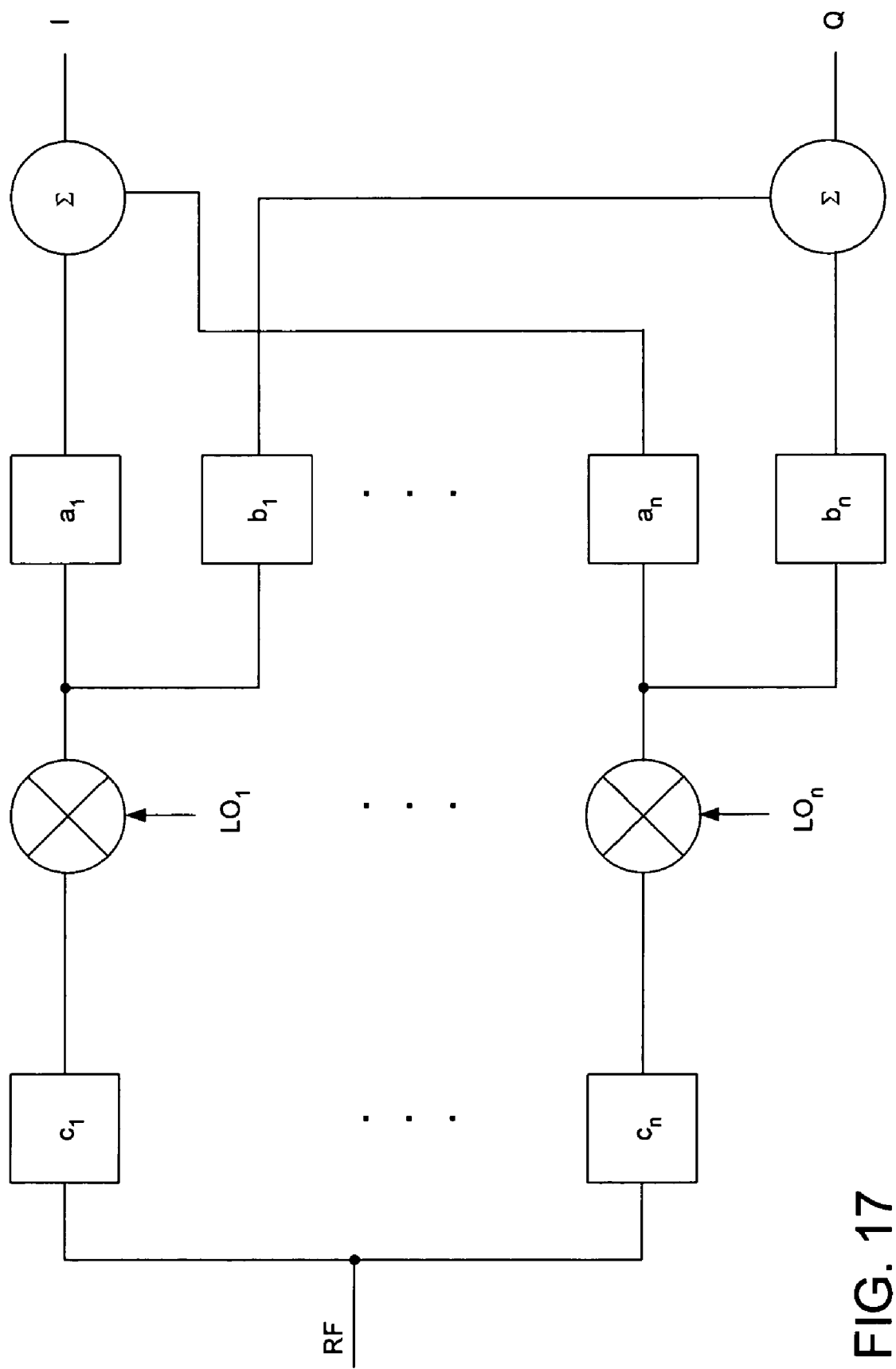
FIG. 17 shows a block diagram of a harmonic suppression mixer according to the present invention.

FIG. 17 shows a block diagram of a harmonic suppression mixer according to the present invention. This block diagram is functionally equivalent to the more detailed diagram shown in FIG. 1. Each mixer has a separate coefficient at each mixer input.

Figure 18:
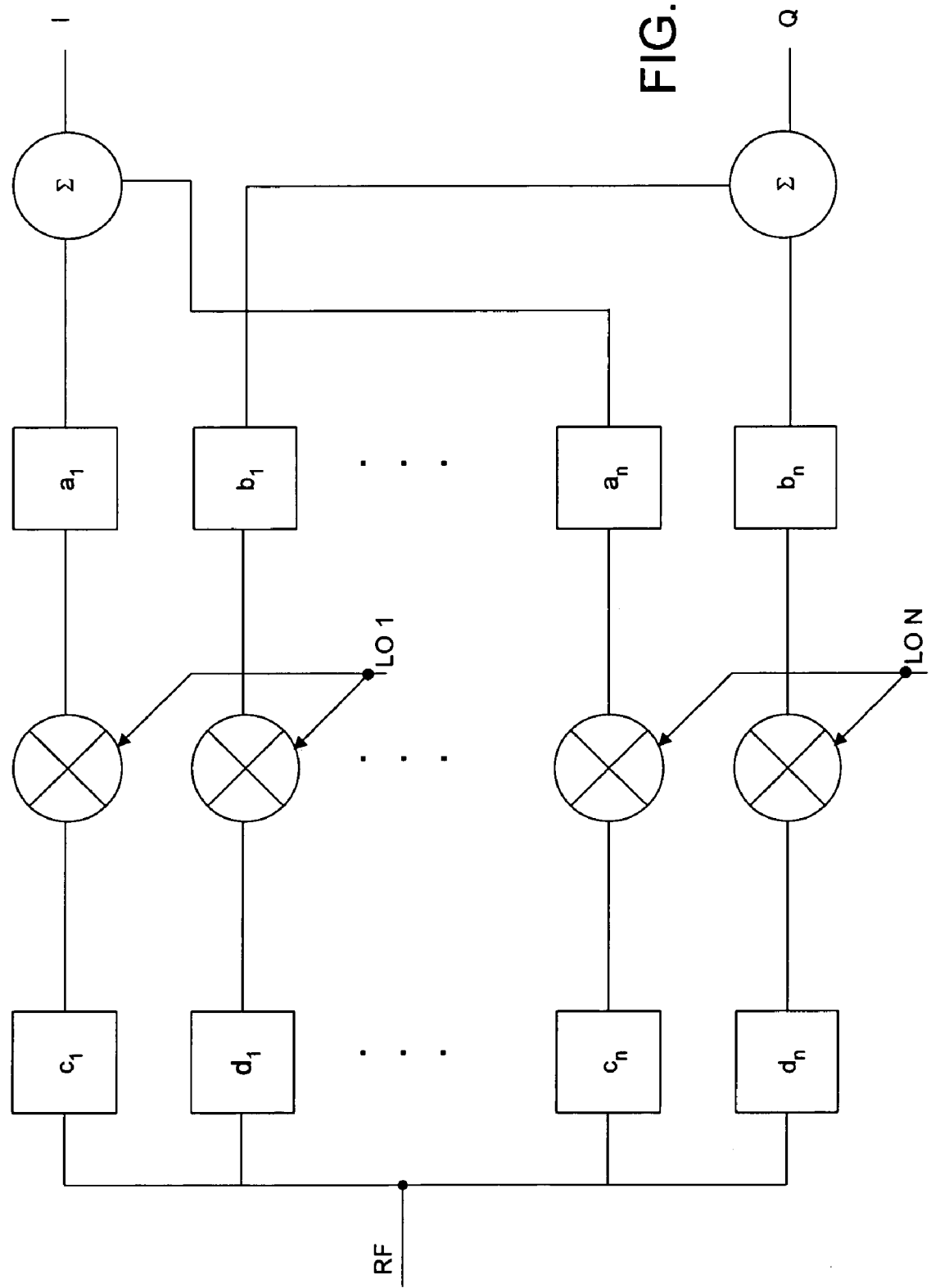
FIG. 18 shows a block diagram of another embodiment of a harmonic suppression mixer according to the present invention.

FIG. 18 shows a block diagram of another embodiment of a harmonic suppression mixer according to the present invention. In this embodiment, a separate mixer is provided in the signal path for the I and Q components of the signal, each mixer has a separate coefficient at the mixer RF input.

Figure 19:
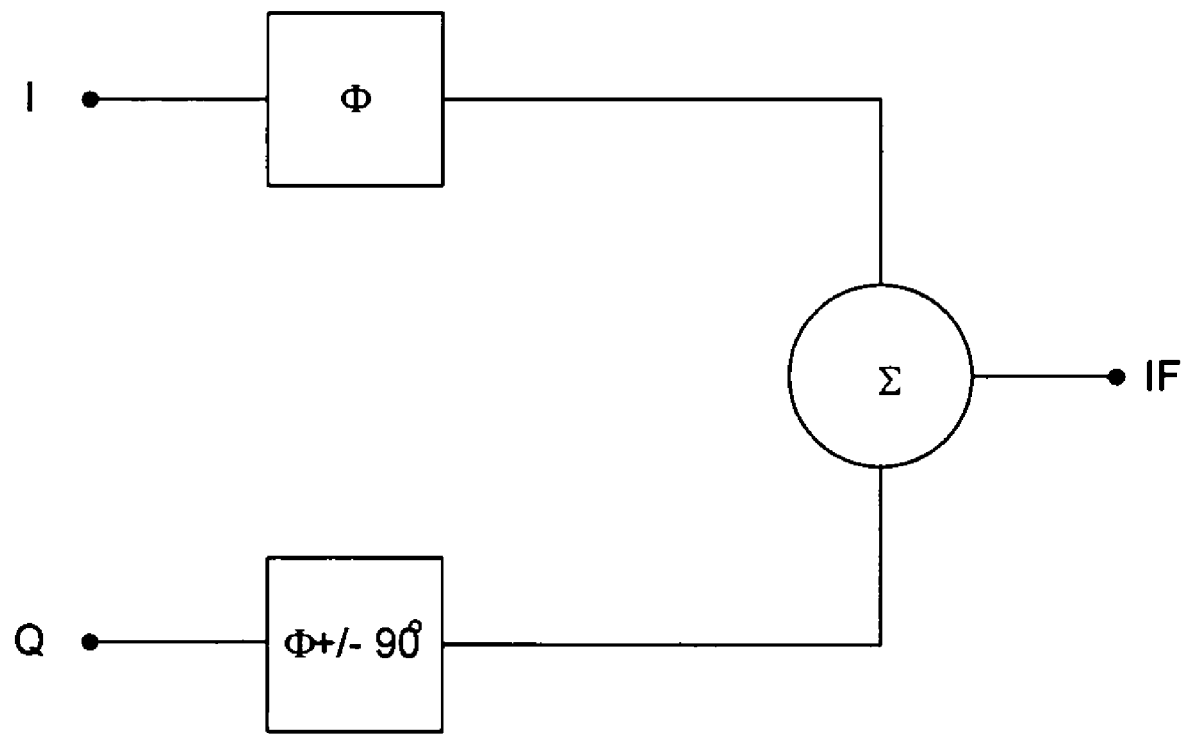
FIG. 19 shows a quadrature combiner for use with the harmonic suppression mixer.

FIG. 19 shows a quadrature combiner for use with the harmonic suppression mixer using differential delay elements in the I and Q path to create a relative 90 degree shift in the signals at the IF frequency. The I and Q inputs to the quadrature combiner can be driven from either embodiment of a harmonic suppression mixer shown in FIG. 1, FIG. 17, or FIG. 18. An example of a differential delay element is a polyphase filter. Quadrature IQ combiner can be implemented in either the analog or digital domain. Polyphase filters are described in Behbahani, F.; Kishigami, Y.; Leete, J.; Abidi, A. A., "CMOS mixers and polyphase filters for large image rejection", IEEE Journal of Solid-State Circuits, Volume: 36, Issue: 6, June 2001 Pages: 873-887

Figure 20:
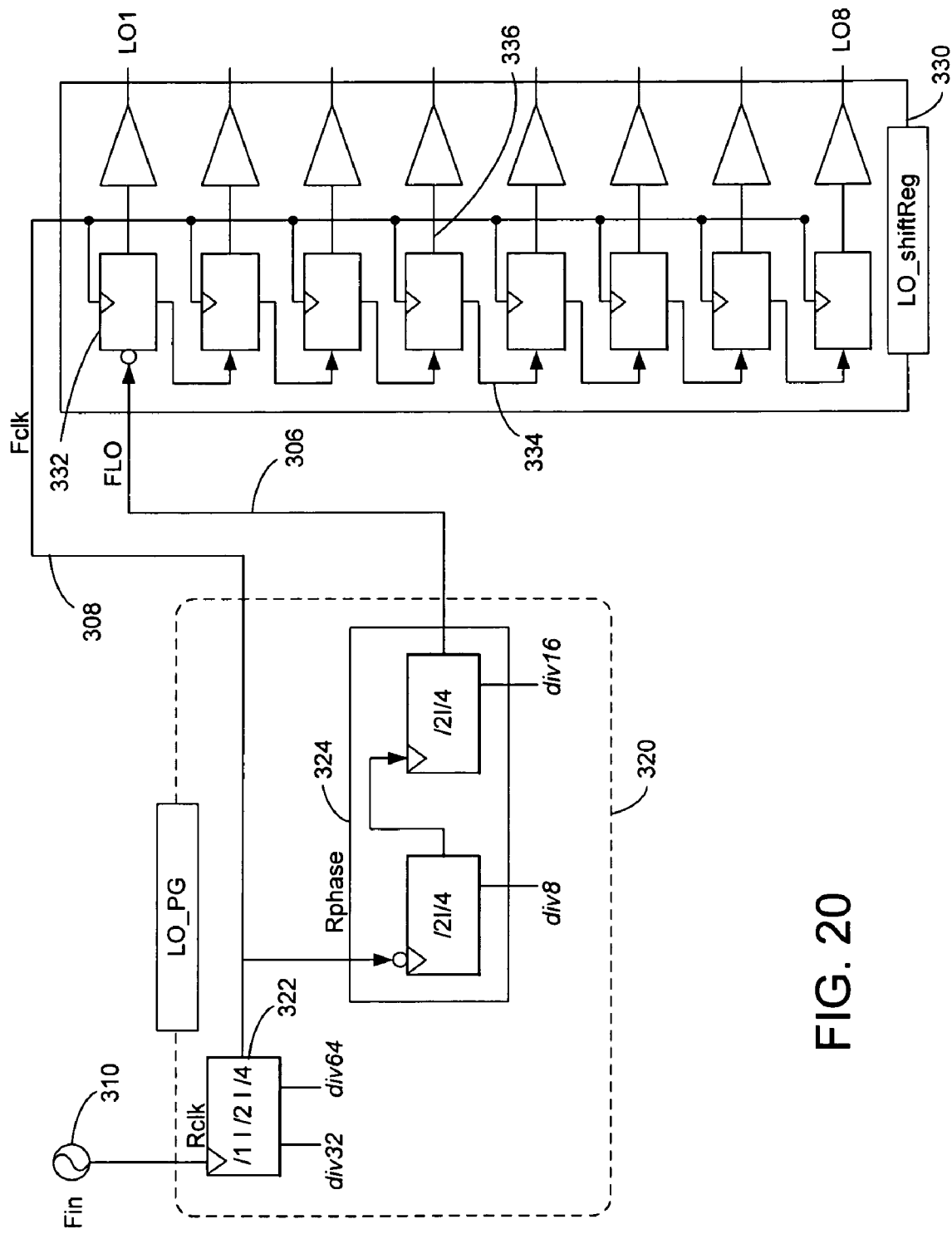
FIG. 20 shows a block diagram of an LO generator for use with the present invention.

FIG. 20 shows a detailed block diagram of a multi-phase LO generator consisting of a pattern generator 320 (LO_PG) and a reclocking shift register 330 (LO_shiftReg). The pattern generator 320 provides the input signal 306 to the first flip-flop 332 of the shift register 330. Each flip-flop in the shift register is identical and the detail of the flip-flop is described below. The pattern generator 320 additionally divides the input frequency (Fin) 310 by divider 322 to supply the reclocking signal 308 to the clock input of all the flip-flops in the shift register 330. Different types of flip-flops can be used, but in this embodiment and as an example, D-type flip-flops are used. The flip-flops herein will be referred to as "DFF". The flip-flops have a slave-master-slave configuration with the master latch and the second slave latch providing outputs. In this particular embodiment, a shift register with 8 flip-flops is described. Other embodiments could vary in the number of flip-flops used in the shift register, depending on the topology of the pattern generator circuit and in the type of circuit to realize the flip-flop functionality.

In the pattern generator circuit 330, the input frequency 310 (Fin) is divided down to the desired LO frequency 306 by two-stage divider 324. This signal is being reclocked at frequency 308 by the eight flip-flop shift register. To describe the functionality, three frequency division ratios are considered:

Rclk is the frequency division ratio of the input frequency 310 (Fin) and the reclocking frequency 308 (Fclk), where Rclk=1, 2 or 4.

Rphase is the frequency division ratio of the reclocking frequency 308 (Fclk) and the input frequency 306 (FLO) of the first DFF, where Rphase=4, 8 or 16.

Rdiv is the total frequency division ratio of the input frequency 310 (Fin) and the LO frequency 306 (FLO). It is equal to Rphase*Rclk, which results in Rdiv=4, 8, 16, 32 or 64.

TABLE 5

Relationship between phases and division ratios

| Division ratios | | | Number of phases |
|---|---|---|---|
| Rclk | Rphase | Rdiv | (nφ) (Modes) |
| 1 | 4 | 4 | 2 |
| 1 | 8 | 8 | 4 |
| 1 | 16 | 16 | 8 |
| 2 | 16 | 32 | 8 |
| 4 | 16 | 64 | 8 |

The division ratio Rphase sets the number of output phases of the LO generator. Using division ratios of 4 up to 16, the output of the shift register bank will provide two, four or eight different phases. An overview of the different modes is given in Table 5. The number of phases is not dependent on the value of Rclk, since both input signal and reclocking signal are divided by this ratio. For values of Rdiv higher than sixteen, the input frequency is divided down by a factor Rclk before splitting the signal between the flip-flop input path and the reclocking path. The modes with division ratios of 32 and 64 therefore still have a resolution of π/8 (1/16th of a period), resulting in eight phases at the output of the shift register.

Output 334 (the master latch output) of each flip-flop is used as input for the next flip-flop. In order to avoid extra (possibly asymmetric) loading on the sensitive slave output 336, an extra latch clocked on the slave clock phase is inserted as the input stage of each DFF, and the output is taken from the master latch of the previous DFF. To minimize the loading effect on the master latch, an emitter follower or source follower is used to drive the two slaves.

Figure 21:
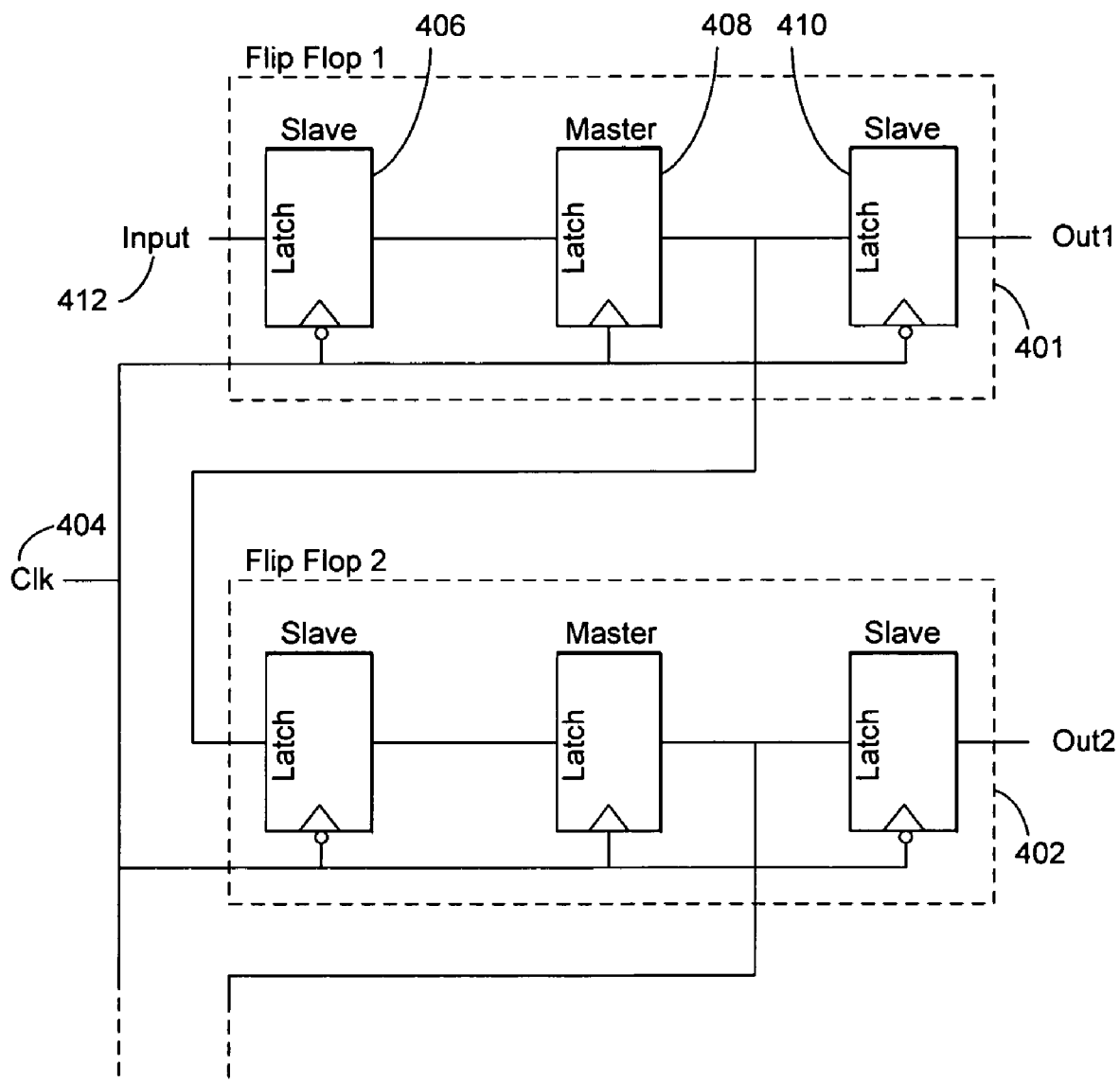
FIG. 21 shows a flip-flop for use with the LO generator of the present invention.

FIG. 21 shows the details of the shift register flip-flops and the interconnection of two consecutive flip-flops 401 and 402 each having two slave latches. Master and slave latches are active or triggered on opposite phases or phase edges of the clock signal 404 (Clk). Clk 404 is driven by Fclk 308. Slave latch 406 at the input of each flip-flop drives the master latch 408 inside the same flip-flop. Master latch 408 drives the second slave latch 410 inside the same flip-flop and also the first slave latch 406 of the following flip-flop in the shift register. The total number of flip-flops interconnected in this way is set by the number of desired output signals. Signal 412 is the input signal of the first flip-flop in the shift register. Using this kind of interconnection, the output slave is not loaded by the next flip-flop and edge transitions can be faster and better defined in time and feed-through of the master clock to the slave output is avoided.

The connection of the clock line 404 limits the ratio of the re-clock frequency and the LO frequency (Fclk/FLO) to a minimum of 4. In this clocking scheme, the output signal phase accuracy is not sensitive to the duty cycle of the clock signal.

Using an alternative clocking scheme, the minimum ratio of Fclk/FLO can be decreased to 2. More specifically this can be done by using both phases or edges of the clocking signal. For example, all odd numbered flip-flops would be clocked at the positive phase or rising clock edge and all even numbered flip-flops would be clocked at the negative phase or falling edge. The edge or phase that clocks the master latch is considered the edge or phase that clocks the flip-flop. Other configurations could also be used to realize the same minimum ratio of Fclk/FLO. This clocking scheme is sensitive to duty cycle.

Figure 22:
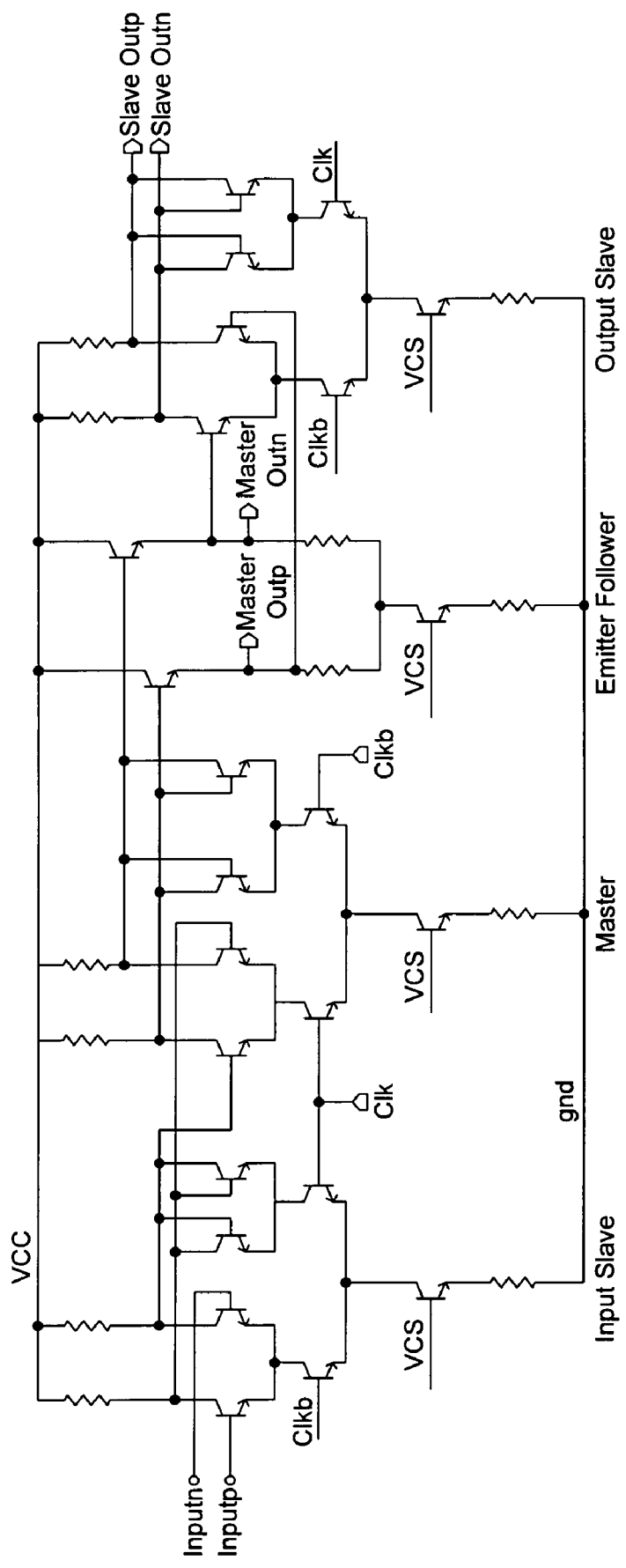
FIG. 22 shows a schematic of a flip-flop of the present invention.

FIG. 22 shows an example of a detailed implementation of an edge-triggered double-slave flip-flop using emitter coupled logic (ECL). Other implementations could differ in the type of event that triggers the flip-flop (clock edge, clock level, etc), in the type of technology used (bipolar, BiCMOS, CMOS, GaAS, etc.), or in the type of logic or in any detail of the used circuit topology to realize the double-slave flip-flop functionality.

Figure 23:
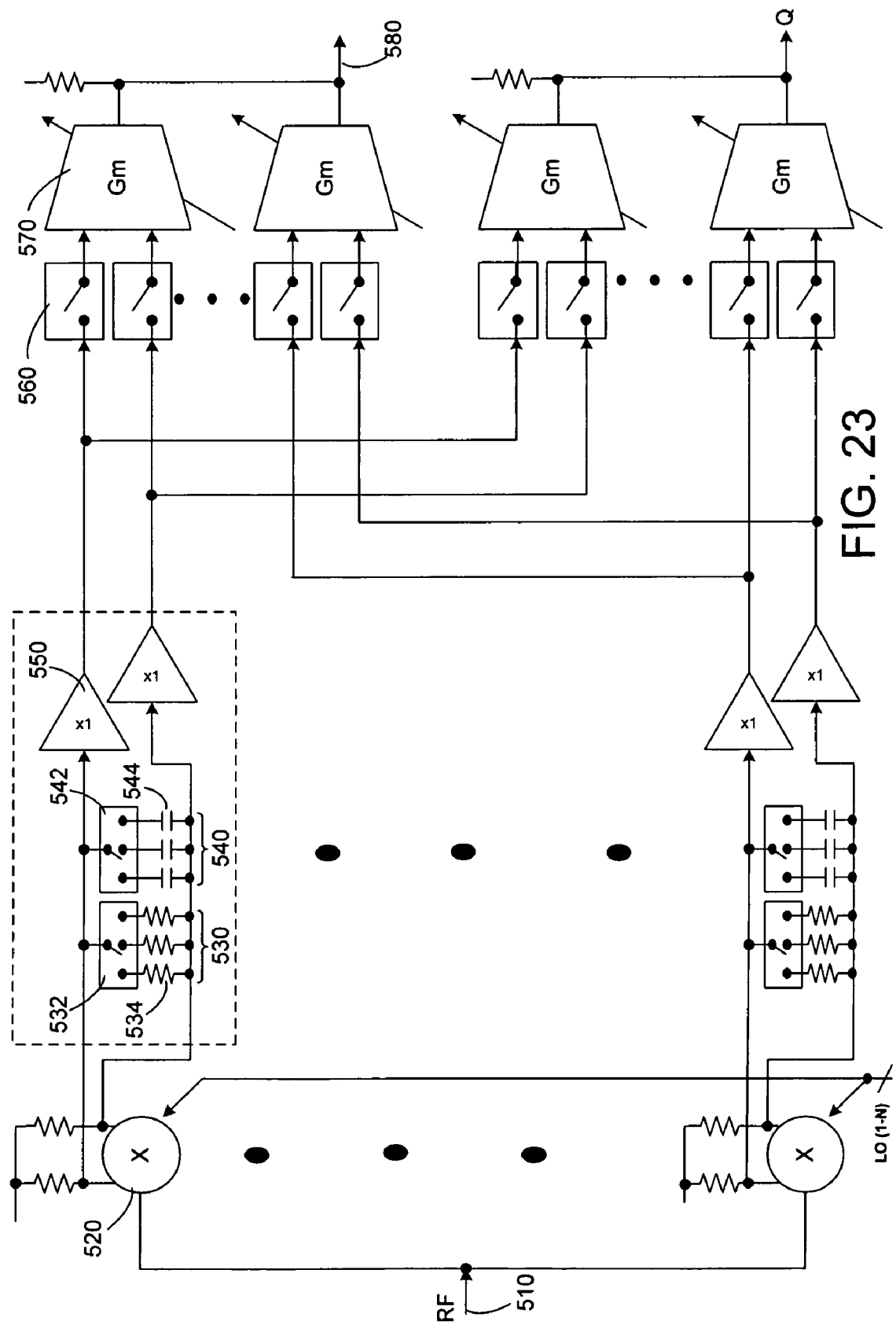
FIG. 23 shows an embodiment of the harmonic mixer according to the present invention.

FIG. 23 shows an embodiment of the harmonic suppresion mixer. RF input 510 drives all mixers 520. Mixer 520 outputs are coupled to switchable gain control 530 with resistors 534 determining the gain and switch 532 selecting which gain determining resistors 534 are connected. Switchable filter 540 uses switch 542 to connect capacitors 544, which determine the frequency of one pole of the filter. Buffer amplifiers 550 drive programmable amplifiers 570, which can be used to set the coefficient value associated with each mixer. Switches 560 can be used to isolate mixer signals in configurations where less than all of the mixers 520 are used. The switches can also be used to invert polarity of the signal. Summing node 580 combines all mixer signals into a composite signal. I and Q outputs are the signal components of the baseband down converted signal.

Table 6 shows example options using single and multiple cycles within an LO period and for optimizing VCO range or harmonic suppression.

TABLE 6

| | | | Option 1: No multiple cycles used | | | | |
|---|---|---|---|---|---|---|---|
| | min | max | VCO range fmax/fmin = 2 | | | | |
| fvco | 1720 | 3440 MHz | | | Lowest harmonic | | |
| Number | # cycles per | VCO div ratio | Final LO range | | conversion freq | | |
| LO phases | LO period | before LO gen | min | max | min | max | Comment |
| 8 | 1 | 4 | 50.00 | 53.75 | 750.00 | 806.25 | Rejection up to 15th harmonic |
| 8 | 1 | 2 | 53.75 | 107.50 | 806.25 | 1612.50 | Rejection up to 15th harmonic |
| 8 | 1 | 1 | 107.50 | 215.00 | 1612.50 | 3225.00 | Rejection up to 15th harmonic |
| 4 | 1 | 1 | 215.00 | 430.00 | 1505.00 | 3010.00 | Rejection up to 7th harmonic Standard I/Q mixer: No |
| 2 | 1 | 1 | 430.00 | 860.00 | 1290.00 | 2580.00 | rejection of 3rd harmonic |

TABLE 6-continued

Option 2: Multiple cycles used - VCO range minimised - improved harmonic rejection at high band

| | min | max | VCO range fmax/fmin = 1.5 | | | | |
|---|---|---|---|---|---|---|---|
| fvco | 3057.77778 | 4586.667 MHz | | | Lowest harmonic | | |
| Number | # cycles per | VCO div ratio | Final LO range | | conversion freq | | |
| LO phases | LO period | before LO gen | min | max | min | max | Comment |
| 8 | 1 | 8 | 35.83 | 50.00 | 537.45 | 750.00 | Rejection up to 15th harmonic |
| 8 | 3 | 16 | 50.00 | 53.75 | 216.67 | 232.92 | Rejection up to 4⅓ × fLO |
| 8 | 1 | 4 | 53.75 | 71.67 | 806.25 | 1075.00 | Rejection up to 15th harmonic |
| 8 | 3 | 8 | 71.67 | 107.50 | 310.56 | 465.83 | Rejection up to 4⅓ × fLO |
| 8 | 1 | 2 | 107.50 | 143.33 | 1612.50 | 2150.00 | Rejection up to 15th harmonic |
| 8 | 3 | 4 | 143.33 | 215.00 | 621.11 | 931.67 | Rejection up to 4⅓ × fLO |
| 8 | 1 | 1 | 215.00 | 286.67 | 3225.00 | 4300.00 | Rejection up to 15th harmonic |
| 8 | 3 | 2 | 286.67 | 430.00 | 1242.22 | 1863.33 | Rejection up to 4⅓ × fLO |
| 4 | 1 | 1 | 430.00 | 573.33 | 3010.00 | 4013.33 | Rejection up to 7th harmonic |
| 8 | 3 | 1 | 573.33 | 860.00 | 2484.44 | 3726.67 | Rejection up to 4⅓ × fLO |

Option 3: Multiple cycles used - harmonic rejection optimised

| | min | max | VCO range fmax/fmin = 2 | | | | |
|---|---|---|---|---|---|---|---|
| fvco | 2293.33333 | 4586.667 MHz | | | Lowest harmonic | | |
| Number | # cycles per | VCO div ratio | Final LO range | | conversion freq | | |
| LO phases | LO period | before LO gen | min | max | min | max | Comment |
| 8 | 1 | 4 | 50.00 | 71.67 | 750.00 | 1075.00 | Rejection up to 15th harmonic |
| 8 | 1 | 2 | 71.67 | 143.33 | 1075.00 | 2150.00 | Rejection up to 15th harmonic |
| 8 | 1 | 1 | 143.33 | 286.67 | 2150.00 | 4300.00 | Rejection up to 15th harmonic |
| 4 | 1 | 1 | 286.67 | 573.33 | 2006.67 | 4013.33 | Rejection up to 7th harmonic |
| 8 | 3 | 1 | 573.33 | 860.00 | 2484.44 | 3726.67 | Rejection up to 4⅓ × fLO |

What is claimed is:

1. A harmonic suppression mixer (HSM) for down-conversion of a radio frequency (RF) signal, the HSM comprising:
 a) a plurality of mixers, each with a local oscillator (LO) input, an RF input, and a mixer output, wherein each RF input is driven by the RF signal;
 b) at least one gain stage, each gain stage for weighting the signals output by the mixers;
 c) a summer for summing the weighted mixer output signals to produce a summer output; and
 d) an LO generator for generating a plurality of LO signals in one of a plurality of modes, each LO signal coupled to an LO input of a respective one of the mixers, each LO signal operating at substantially the same frequency, the phases of the LO signals being selectable such that in a first of the plurality of modes the relative phase of each of the LO signals is unique, the first mode being used for down-converting relatively lower RF signals and in at least a second of the plurality of modes used for down-converting relatively higher RF signals, the relative phase of at least some of the LO signals is the same, thereby reducing the effective number of mixers without altering the connections between the LO generator and the plurality of mixers when switching between modes.

2. The HSM of claim 1, wherein the at least one gain stage varies the gain of at least one input to the summer in response to the modes of the LO generator to assist in configuring the HSM to have a variable number of effective mixers.

3. The HSM of claim 1, further including:
 a) a plurality of first coefficient stages that weight the mixer output signals using in-phase coefficient values coupled to the summer to produce from the summer an in-phase summer output;
 b) a plurality of second coefficient stages that weight the mixer output signals with quadrature-phase coefficient values; and
 c) a second summer coupled to the second coefficient stages to produce from the second summer a quadrature summer output.

4. The HSM of claim 3, wherein at least one of the gain stages performs the function of at least one of the coefficient stages.

5. The HSM of claim 3, wherein the mixers are grouped into an in-phase (I) bank and a quadrature (Q) bank, and the first coefficient stages are connected to the I bank and the second coefficient stages are connected to the Q bank, and one mixer from the I bank and one mixer from the Q bank is driven by the same LO signal.

6. The HSM of claim 3, wherein the first coefficient stages and the second coefficient stages are programmable for a plurality of unique gain values that produce a sinusoidal weighting profile.

7. The HSM of claim 1, wherein at least one of the gain stages has an input and an output, the input coupled to a respective mixer output.

8. The HSM of claim 1, wherein at least one of the gain stages has an input and an output, the output coupled to a respective mixer RF input.

9. The HSM of claim 1, wherein the RF inputs are weighted by varying the transconductance parameter of the mixers and the mixer outputs are summed directly together at a summing node to produce the output.

10. The HSM of claim 1, wherein the LO generator for producing a series of digital signals to drive the mixer LO inputs comprises:
 a) a pattern generator that determines an LO frequency; and b) a shift register coupled to the pattern generator that creates the LO signals and drives the mixer LO inputs.

11. The HSM of claim 10, wherein the pattern generator divides a clock signal by a ratio that can be changed.

12. The HSM of claim 1, the LO generator comprises a reconfigurable state machine for producing a series of staggered digital signals to drive the mixer LO inputs.

13. The HSM of claim 12, further comprising a register bank for re-clocking the staggered digital signals.

14. The HSM of claim 1, wherein each mixer output is digitized by an analog to digital converter and the weighting and the combining is performed in the digital domain.

15. The HSM of claim 1, wherein the HSM covers an input RF frequency range spanning 50 MHz to 860 MHz.

16. A tuner comprising:
   a) a harmonic suppression mixer (HSM) having:
      i) a plurality of mixers, each with a local oscillator (LO) input, an RF input, and a mixer output, wherein each RF input is driven by an RF signal;
      ii) at least one gain stage, each gain stage coupled to one of the plurality of mixers for weighting the signals that are mixed by the mixers;
      iii) an in-phase summer for summing the weighted mixer signals to produce an in-phase summer output;
      iv) a quadrature summer for summing the weighted mixer signals to produce a quadrature summer output; and
      v) an LO generator for generating a plurality of LO signals in one of a plurality of modes, each LO signal coupled to an LO input of a respective one of the mixers, each LO signal operating at substantially the same frequency, the phases of the LO signals being selectable such that in a first of the plurality of modes the relative phase of each of the LO signals is unique, the first mode being used for down-converting relatively lower RF signals and in at least a second of the plurality of modes used for down-converting relatively higher RF signals the relative phase of at least some of the LO signals is the same, thereby reducing the effective number of mixers without altering the connections between the LO generator and the plurality of mixers when switching between modes;
   b) an in-phase band limiting filter coupled to the in-phase output of an image rejection adjustment circuit, the in-phase band limiting filter outputting an I signal; and
   c) a quadrature band limiting filter coupled to the quadrature output of the image rejection adjustment circuit, the quadrature band limiting filter outputting a Q signal.

17. The RF tuner of claim 16, further comprising an IF up-converter at the output of the in-phase and quadrature band limiting filters to up-convert the I and Q signals output from the in-phase and quadrature band limiting filters.

18. A method of tuning to a signal included within a wideband radio frequency (RF) signal, comprising:
   a) receiving the wideband RF signal;
   b) performing harmonic suppression mixing (HSM) to down convert the wideband RF signal to a lower frequency, the HSM comprising:
      i) mixing, within a plurality of mixers, the wideband RF signal and a plurality of local oscillator signals received from an LO generator, the LO generator for generating a plurality of LO signals in one of a plurality of modes, each LO signal coupled to an LO input of a respective one of the mixers, each LO signal operating at substantially the same frequency, the phases of the LO signals being selectable such that in a first of the plurality of modes the relative phase of each of the LO signals is unique, the first mode being used for down-converting relatively lower RF signals and the relative phase of at least some of the LO signals is the same in at least a second of the plurality of modes used for down-converting relatively higher RF signals thereby reducing the effective number of mixers without altering the connections between the LO generator and the plurality of mixers when switching between modes;
      ii) applying weighting to each mixer signal to produce weighted mixer signals; and
      iii) summing the weighted mixer signals, to generate a composite mixer output at the lower frequency; and
      iv) filtering the composite mixer output.

19. The method of claim 18, wherein the weighting applied to each mixer signal is configurable to be appropriate to the mode of the LO generator.

20. The method of one of claim 18, further comprising: isolating the outputs of some of the mixers and summing the remaining outputs to generate a composite mixer output.

21. The method of one of claim 18, wherein the weighting of each mixer signal is performed by a plurality of first coefficient stages and a plurality of second coefficient stages, the gain of the first coefficient stages can range from less than one to greater than one and the gain of the second coefficient stages can range from less than one to greater than one; and
   a) further comprising summing the output of the second coefficient stages to produce a second lower frequency signal.

22. The method of claim 18, further comprising input coefficient stages, wherein gain is applied to each mixer signal both before and after the mixers, and wherein the value of each coefficient stage can be different.

23. The method of claim 18, wherein after receiving the wideband RF signal, filtering the RF signal is achieved by a tunable pre-select filter.

24. The method of claim 18, wherein:
   a) after receiving the wideband RF signal, the wideband RF signal goes through a variable attenuator;
   b) the attenuated wideband RF signal drives a buffer amplifier;
   c) the output of the buffer amplifier is filtered by a pre-select filter; and
   d) the output of the pre-select filter drives the HSM.

25. The method of claim 18, comprising digitizing the outputs from each mixer before combining, and performing the weighting and combining in the digital domain.

26. The method of claim 18, further comprising: suppressing the image signal.

27. The method of claim 18, wherein the lower frequency is an IF frequency I and Q signal and further comprising quadrature combining of the I and Q signals to form an output signal.

* * * * *